United States Patent
Greidinger et al.

(10) Patent No.: US 6,567,967 B2
(45) Date of Patent: May 20, 2003

(54) METHOD FOR DESIGNING LARGE STANDARD-CELL BASE INTEGRATED CIRCUITS

(75) Inventors: Yaacov I. Greidinger, Herzia (IL); David S. Reed, Los ALtos, CA (US); Ara Markosian, Cupertino, CA (US); Stephen P. Sample, Saratoga, CA (US); Jonathan A. Frankle, Los Gatos, CA (US); Hasmik Lazaryan, Yerevan (AM)

(73) Assignee: Monterey Design Systems, Inc., Sunnyvale, CA (US)

( * ) Notice: Subject to any disclaimer, the term of this patent is extended or adjusted under 35 U.S.C. 154(b) by 0 days.

(21) Appl. No.: 09/874,942

(22) Filed: Jun. 4, 2001

(65) Prior Publication Data

US 2002/0087940 A1 Jul. 4, 2002

Related U.S. Application Data

(60) Provisional application No. 60/230,387, filed on Sep. 6, 2000.

(51) Int. Cl.[7] .................................................. G06F 9/45
(52) U.S. Cl. ............................. 716/10; 716/7; 716/12
(58) Field of Search ............................. 716/10, 9, 8, 7, 716/12, 13, 14

(56) References Cited

U.S. PATENT DOCUMENTS

| | | | |
|---|---|---|---|
| 4,612,618 A | * 9/1986 | Pryor et al. | 716/10 |
| 4,630,219 A | * 12/1986 | DiGiacomo et al. | 716/9 |
| 4,918,614 A | 4/1990 | Modarres et al. | 716/10 |
| 5,175,693 A | 12/1992 | Kurosawa et al. | 716/17 |
| 5,311,443 A | 5/1994 | Crain et al. | 716/10 |
| 5,576,969 A | 11/1996 | Aoki et al. | 716/19 |
| 5,696,013 A | 12/1997 | Ema | 438/48 |
| 5,731,985 A | 3/1998 | Gupta et al. | 716/8 |
| 5,933,356 A | 8/1999 | Rostoker et al. | 703/15 |
| 6,009,251 A | * 12/1999 | Ho et al. | 716/5 |
| 6,145,117 A | 11/2000 | Eng | 716/18 |
| 6,292,929 B2 | 11/2000 | Eng | 716/14 |
| 6,275,973 B1 | * 8/2001 | Wein | 716/10 |
| 6,298,468 B1 | 10/2001 | Zhen | 716/2 |
| 6,378,115 B1 | 4/2002 | Sakurai | 716/7 |

OTHER PUBLICATIONS

Ottan, Efficient Floorplan Optimization, pp. 499–502, IEEE 1983.
Stockmeyer, Optimal Orientations of Cells in Slicing Floorplan Designs, Information and Control, vol. 57, Nos. 2/3, May/Jun. 1983, pp. 91–101.
Dutt, et al., A Probability–Based Approach to VLSI Circuit Partitioning, Department of Electrical Engineering, Univ. of Minnesota, Minneapolis, pp. 100–105, 1996.
Cong, et al., Interconnect Design for Deep Submicron ICs, Computer Science Dept., UCLA, 1997 IEEE.

* cited by examiner

Primary Examiner—Don Wong
Assistant Examiner—Thuy Vinh Tran
(74) Attorney, Agent, or Firm—Vierra Magen Marcus Harmon & DeNiro LLP

(57) ABSTRACT

An automated method of designing large digital integrated circuits using a software program to partition the design into physically realizable blocks and then create the connections between blocks so as to maximize operating speed and routability while minimizing the area of the resulting integrated circuit. Timing and physical constraints are generated for each physically realizable block so that standard-cell place and route software can create each block independently as if it were a separate integrated circuit.

36 Claims, 21 Drawing Sheets

METHOD FOR DESIGNING LARGE STANDARD-CELL BASE INTEGRATED CIRCUITS

CROSS REFERENCE TO RELATED APPLICATIONS

This application claims the benefit of U.S. Provisional Application Ser. No. 60/230,387 filed on Sep. 6, 2000, the contents of which are incorporated herein by reference in their entirety.

In addition, the contents of co-pending application Ser. Nos. 09/227,491 filed on Jan. 7, 1999 and 09/227,023 filed on Jan. 7, 1999 are incorporated herein by reference in their entirety.

FIELD OF THE INVENTION

This invention generally relates to the design of integrated circuits and more particularly to methods for physically designing very large integrated circuits.

BACKGROUND OF THE INVENTION

There are two basic techniques for physically designing digital integrated circuits (or chips). These are commonly known as the full-custom technique and the standard-cell technique. In the full-custom technique, small blocks (or cells) are manually laid out by hand, one rectangle or polygon at a time to build first transistors, then logic gates, and then more complex circuits. A "block" is a small portion of a design that is designed and/or laid out separately. The cells are assembled together into larger groups (or blocks) which are themselves assembled into still larger blocks until a complete integrated circuit is created. For complex chip designs, this layout and assembly process requires large numbers of highly skilled designers and a long period of time.

The standard-cell technique for designing chips is a much simpler process and has gained wide use. Physical layouts and timing behavior models are created for simple logic functions such as AND, OR, NOT or FlipFlop. These physical layouts are known as "standard cells". A large group of pre-designed standard cells is then assembled into a standard cell library, which is typically provided at a nominal cost by the fabrication vendor who will eventually produce the actual chip. Examples of these standard cell libraries are available from fabrication vendors such as TSMC or UMC. Automated software tools available from companies such as Cadence Design Systems, Inc. and Synopsys Corp. can take a netlist description of the integrated circuit, or "netlist" representing the desired logical functionality for a chip (sometimes referred to as a behavioral or register-transfer-level description), and map it into an equivalent netlist composed of standard cells from a selected standard cell library. This process is commonly known as "synthesis".

Other software tools available from companies such as Cadence or Avant! can take a netlist comprised of standard cells and create a physical layout of the chip by placing the cells relative to each other to minimize timing delays or wire lengths, then creating electrical connections (or routing) between the cells to physically complete the desired circuit. The standard cell technique generally produces chips that are somewhat slower and larger than chips designed using the full-custom technique. However, because the process is automated, chips can be designed much more quickly and with fewer people, compared to the full-custom technique. For these reasons, most digital logic chips today are designed using the standard-cell technique.

The standard-cell technique relies heavily on automated software tools to place and route the standard cells. Today, these tools work well with designs that contain less than a few hundreds of thousands of standard cells. The internal algorithms used for placement and routing, however, are non-linear as the size of the design increases. As an illustration, a design containing 500,000 standard cells would take more than twice as long to place and route as a design containing 250,000 standard cells. A design having 500,000 standard cells would also be more than twice as large as a design having 250,000 standard cells, and will run slower. In addition, the available computer memory can be a significant limitation on the maximum size of design that can be created. As a result of these effects, designs above a certain size are not practical to create using the standard-cell approach. Integrated circuit fabrication technology, moreover, has been developing at an exponential rate. A commonly accepted heuristic known as Moore's law states that chip complexity will double every three years.

Some chips being designed today have already reached the point where the standard-cell design technique does not give adequate results, either in terms of development time, chip size or operating speed. This situation will become common in the near future as chip complexity continues to grow. Moreover, in most cases, the full-custom technique is also not practical for designing such large chips because of the inherent long and expensive development process. The full-custom technique is generally used only on very high speed or very high volume designs such as microprocessors where the extra design effort can be offset by higher prices or higher production volumes. Designers have dealt with the limitations of the standard-cell design technique by manually splitting the chip into a number of sections (called place and route units or PRUs) that can then be designed individually using the standard-cell technique.

Splitting the physical chip design into sections allows larger chips to be designed but also creates new design problems relating to how the chip is split into PRUs and how the interactions between PRUs are managed. These problems become intractable for a person to handle manually if there are more than a few PRUs.

Thus, there is a need for an automated design method that will split a large digital integrated circuit design into multiple sections and handle the interactions between sections so that each section can be designed independently and the desired design time, chip size and timing behavior are achieved.

SUMMARY OF THE INVENTION

A method for designing large digital integrated circuits is described. This method consists of several steps, each implemented by a software tool. Most commonly, the steps include those listed below. A particular chip design may not require all of these steps or may have additional steps.

The above and other preferred features of the invention, including various novel details of implementation and combination of elements will now be more particularly described with reference to the accompanying drawings and pointed out in the claims. It will be understood that the particular methods and circuits embodying the invention are shown by way of illustration only and not as limitations of the invention. As will be understood by those skilled in the art, the principles and features of this invention may be employed in various and numerous embodiments without departing from the scope of the invention.

BRIEF DESCRIPTION OF THE DRAWINGS

Reference is made to the accompanying drawings in which are shown illustrative embodiments of aspects of the invention, from which novel features and advantages will be apparent.

DETAILED DESCRIPTION OF THE DRAWINGS

Turning to the figures, the presently preferred apparatus and methods of the present invention will now be described.

Figure 1:
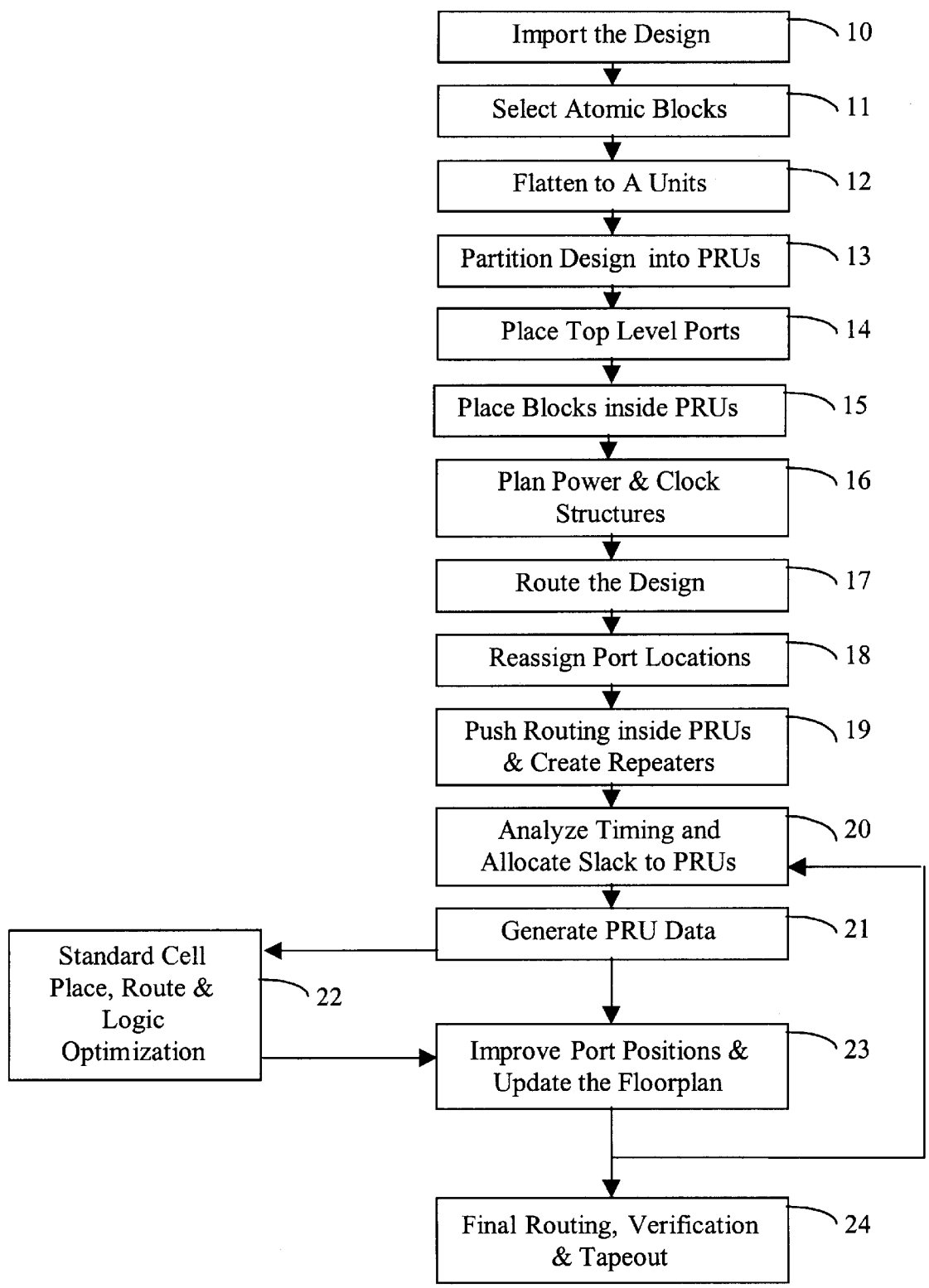
FIG. 1 is a flowchart showing an automated method for designing large integrated circuits according to an embodiment of the present inventions.

Referring first to FIG. 1, an embodiment of an automated method for designing large integrated circuits will be discussed in detail. Briefly, these steps, each of which will be described in more detail, are as follows:

Importing the design 10—Read in the design data consisting of a netlist, a fabrication technology description, a standard-cell library and physical layouts for predesigned blocks. Additional information such as timing models, timing constraints, physical placement constraints and grid definitions may also be read in. The imported data is stored in a database which is implemented in one or more files on a computer disk.

Defining Atomic ("A") blocks (sometimes called "units") 11—"A" blocks are the netlist blocks that will be physically partitioned to create place and route units (PRUs). "A" blocks may contain only standard cells or they may contain additional levels of hierarchy. For the purpose of partitioning the circuit design into PRUs, the "A" blocks are indivisible.

Flattening the design to "A" blocks 12—Levels of hierarchy above the "A" blocks are removed.

Partitioning the design into PRUs 13—The netlist from the previous step is partitioned into PRUs. Partitioning is the process of creating an additional level of hierarchy so that some of the "A" blocks and hard blocks are in one PRU and some are in another. It is desirable that this partitioning be done so as to minimize the total length of the interconnect between "A" blocks, hard blocks and standard cells and also to minimize the total area of the chip. It may also be desirable to partition so that timing paths required to operate at high speed remain within one PRU. A new netlist representing the modified hierarchy is also generated at this stage.

Placing top level ports 14—Ports, which allow interconnections between PRUs and/or other circuit elements, are temporarily placed into the physical design.

Placing blocks inside PRUs 15—Blocks are placed (i.e., positioned) inside PRUs, with special attention placed on producing a good hard block placement within each PRU.

Planning the power and clock structures 16—Power and clock structures must be created so that power and clocks can be distributed to all of the standard cells and hard blocks that compose the physical chip. Typically, power and clock structures are created as grids or trees of metal interconnect.

Routing the design 17—A software tool known as a router is used to make the interconnections between PRUs and also between PRUs and the external pad cells.

Assigning port locations 18—Where an interconnect path crosses the edge of a PRU, a port is created. A port is a small metal rectangle used to make a connection between a net at the top level of the design and a net within a PRU. For nets going between adjacent PRUs, the ports may touch, avoiding the need for any routing at the top level. Placement of the ports is critical to achieving a routable design.

Pushing routing into the PRUs and creating repeaters 19—Nets crossing over the PRUs are pushed inside. Pushing a net inside a PRU causes additional ports to be created on the edge of the PRU and both the external and internal netlists to be modified. At this step, repeaters may also be added within the PRU. Repeaters are buffers or inverters which are added on long nets to reduce signal delays and improve rise/fall times. Top level power and clock nets are also pushed into the PRUs.

Allocating timing budget 20—If the design is timing critical, timing budgets may be allocated to the PRUs. The timing budget is the available timing delay on individual signals which may be used for interconnect within the PRUs without affecting the performance of the overall chip.

Generating data for PRU place and route 21—Data files are generated which describe the shape of PRUs, the location of ports, the internal netlist, the timing slack and other information required for standard-cell place and route.

Creating layout for PRUs 22—Standard cell place and route tools such as those available from Cadence or Avant!

are used to physically create each PRU. The result is a new set of files which describe the physical layout of the PRU, the timing behavior and the degree of routing congestion.

Improving port positioning 23—Based on the physical layout of the PRUs, the routing congestion and the timing behavior information, port locations may be moved to shorten nets, improve timing or to reduce routing congestion. If ports are moved, the previous step is repeated again. This loop continues until the chip is completely routed and meets the timing objectives. If the chip cannot be completely routed or timing objectives cannot be met, it may be necessary to go back to an earlier step in the flow. This circumstance is expected to be infrequent, however.

Creating final routing and tape out the chip 24—After all of the PRUs have been created satisfactorily, any additional routing needed to connect IO pads is added. Finally, design rule checks, layout vs. schematic checks and timing checks are run to verify that the design is correct. This completes the design process.

The steps to be used in each actual design may vary for particular integrated circuit designs. Some steps may not be necessary depending upon the type of design. For example, as discussed below, system on a chip type integrated circuits ("SoC") will probably not require all of these steps. In addition, it is possible that the order of performing each of these steps may be different depending upon the integrated circuit's design.

In the first step 10, design information is imported. This involves reading a series of disk files, extracting the desired information and storing it in a database where it can be referenced later as needed. The database may be saved as a disk file at any step in the design process and reloaded to continue. Importing design data and storing it in a database is a well understood process to those skilled in the art of engineering software development and will not be discussed further here.

There are several types of information that are read from various files or entered manually during the import step, 10. This information typically includes:

Technology information: Information about the process technology including line width and spacing for each metal layer, via rules, and electrical information such as the resistance of each layer and the capacitance between layers. This information is typically available in a LEF format technology file from the fabrication vendor.

Grid Information: Grids define the allowable locations for standard cells, interconnect and block corners. This information may also be extracted from the LEF technology file or may be entered manually.

Average Gate Size: The average gate size is used to estimate block areas when a detailed netlist is not available. It is typically entered manually.

Pad and Hard Block Files: Block size, shape, barriers and port locations for pre-designed pads and other hard blocks such as memories are imported. The LEF format is typically used. A hard block has predefined physical characteristics, i.e., shape, size, layout and timing characteristics. A hard block is often referred to as being "hard".

Standard Cell Libraries: Size, shape and port locations for standard cells is also imported. A LEF format library file containing all of the standard cell information is typically available from the fabrication vendor.

Timing Models: Timing models specify the timing behavior for blocks. Timing models may be imported for hard blocks and standard cells. This information is typically available in TLF (Cadence) format or .lib (Synopsys) format files although other formats may be used or the information may be entered manually.

Timing Constraints: Timing constraints specify the external timing behavior of the integrated circuit. This information is typically taken from the same files used to drive the synthesis program (available from Synopsys or Cadence) that produced the initial gate level netlist for the chip. The information may also be entered manually.

Physical Constraints: Physical constraints define the chip size and shape, location and order of pads, special rules for placement of specific blocks and so forth. Some of this information is typically available in the Cadence DEF format (available from Cadence Design Systems, Inc.) and some must be entered manually.

Netlist: The netlist describes the way standard cells and blocks are interconnected. Netlists are typically available in Verilog or VHDL formats.

Figure 2:
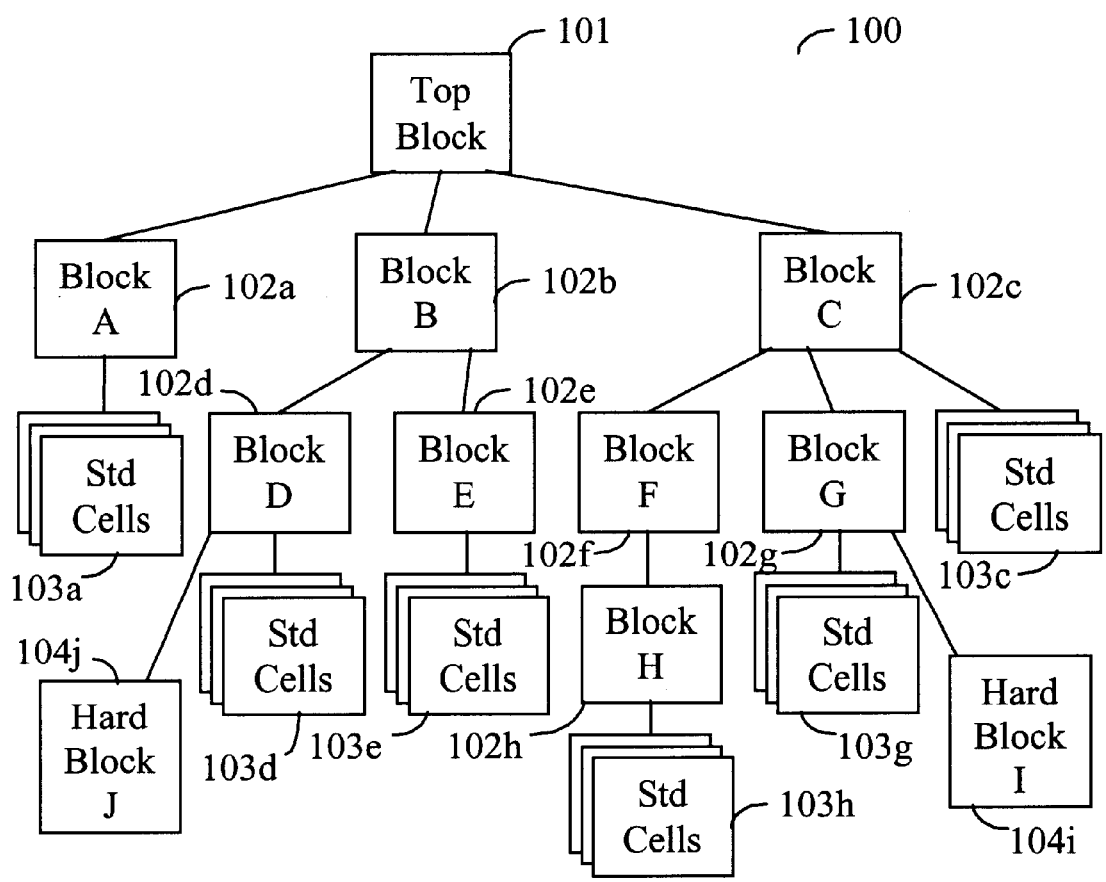
FIG. 2 is a block diagram illustrating a typical logical hierarchy of an integrated circuit design.
Figure 3:
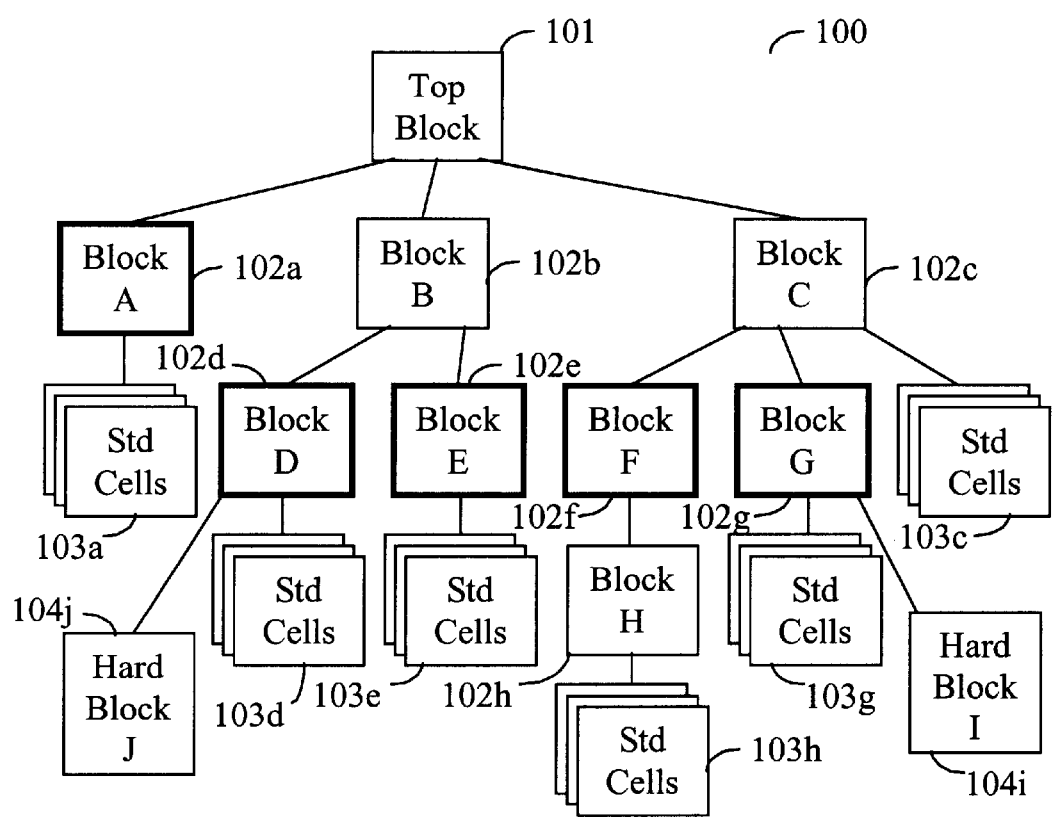
FIG. 3 is a block diagram showing how certain blocks in the netlist are designated as atomic in accordance with an embodiment of the present inventions.

Referring now to FIG. 2, an exemplary design 100 for an integrated circuit having a hierarchical structure and including a number of hierarchical blocks (101, 102a, 102b, 102c, 102d, 102e, 102f, 102g, 102h), pre-designed hard blocks (104i, 104j) and groups of standard cells (103a, 103c, 103d, 103e, 103h, 103g). A typical design will also include input/output ("IO") pads (not shown in FIG. 2). As is obvious to one skilled in the art of integrated circuit design, a real design will contain many more blocks and standard cells than are shown in FIG. 2 and will likely be arranged with an organization different from that shown. The overall design may use many hundreds of thousands or even millions of standard cells. At step 11 of FIG. 1, the netlist for the design is abstracted by selecting "A" blocks as shown in FIG. 3. Every branch in the design's hierarchy must have at least one "A" block. "A" blocks may be selected by listing them in a file. "A" blocks are generally selected to be one or more hierarchy levels above the bottom (often referred to as the "leaf level) of a design to avoid the need to process large numbers of standard cells and simple functional blocks. As will be discussed below, all the elements present in an "A" block will stay together during partitioning. Thus, it is important that "A" blocks not be defined at too high a level of the hierarchy, as this will limit the flexibility of the partitioning step 13 discussed below. Experience has shown that optimal partitioning results are generally obtained using the various embodiments of the present invention when there are several hundred to several thousand "A" blocks in a design.

Figure 4:
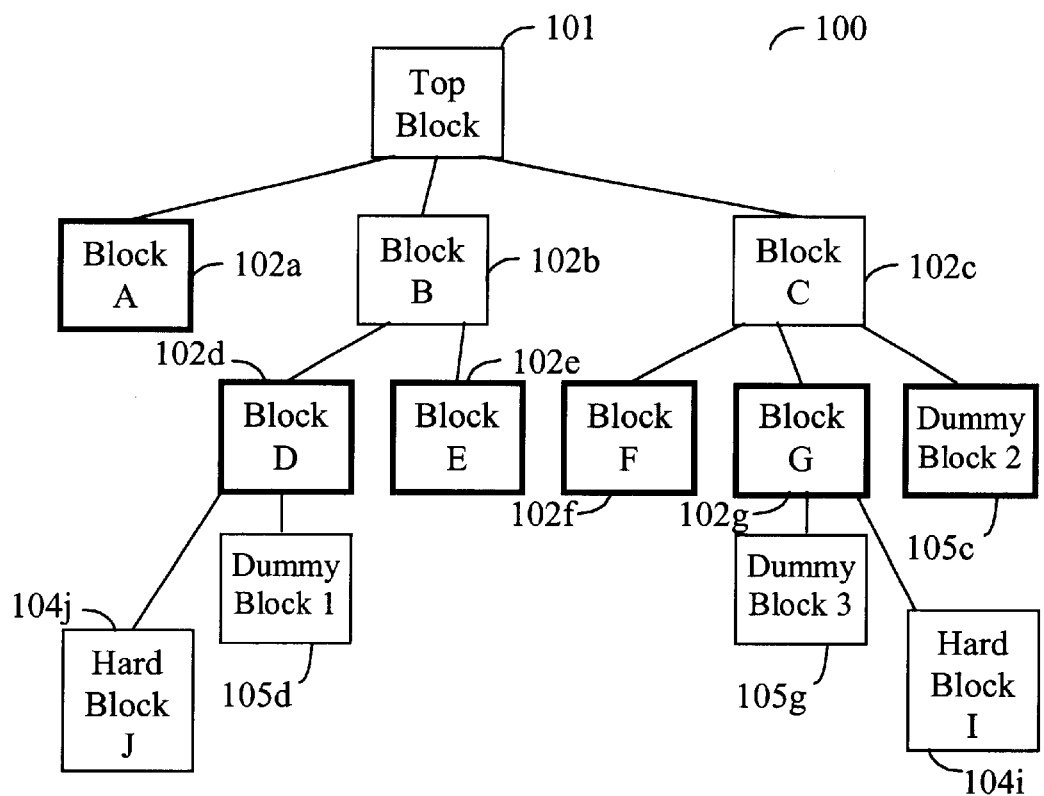
FIG. 4 is a block diagram showing a hierarchy that results when standard cells are not imported.

In FIG. 3, blocks 102a, 102d, 102e, 102f and 102g have been designated as "A" blocks. The netlist may be further simplified by designating some of the "A" blocks as "stopped" blocks. This designation may be done by listing the stopped blocks in a file. Optimal results are generally obtained by designating all "A" blocks that do not contain internal hard blocks as "stopped". When a netlist for a block designated as stopped is imported, only the top level block size will be retained in RAM (Random Access Memory). The block is then referred to as a soft block. The shape of a soft block is arbitrary but the size is determined by the number and size of the standard cells it contains. Lower level netlist information is retained on the computer disk but is not loaded into RAM until step 22 of FIG. 1, Standard Cell Place, Route and Logic Optimization. Abstracting in this manner allows the amount of data required for planning the integrated circuit to be drastically reduced, often by a factor of one thousand or more. FIG. 4 shows the resulting design as it would appear after "A" blocks and stopped blocks have been defined and the lower level blocks and standard cells beneath stopped "A" blocks have been removed. An atomic block can comprise either a hard block (sometimes referred to as a atomic hard block), a soft blocks (sometimes referred to as atomic soft blocks), and hierarchical blocks (sometimes referred to as atomic hierarchical blocks).

Designs may also contain standard cells at various levels of the hierarchy. For example, in FIG. 2, standard cells 103c appear in block 102c. Standard cells 103g also appear with hard block 104i in block 102g. Similarly, standard cells appear with hard block 104j in block 102d. In general, it is not desirable to have large numbers of standard cells mixed with other blocks because of the large amounts of memory and processing time they will consume during block placement and partitioning. For this reason, the standard cells are typically clustered or grouped together into new dummy blocks. A dummy block is a block that did not exist in the original netlist but was created during netlist import as a container for a group of standard cells. The groups of standard cells 103c, 103d and 103g in FIG. 2 are clustered into new dummy blocks 105c, 105d and 105g respectively in FIG. 4. Dummy block 105c becomes an additional "A" block because it does not have any "A" block above it in the netlist hierarchy.

Figure 5:
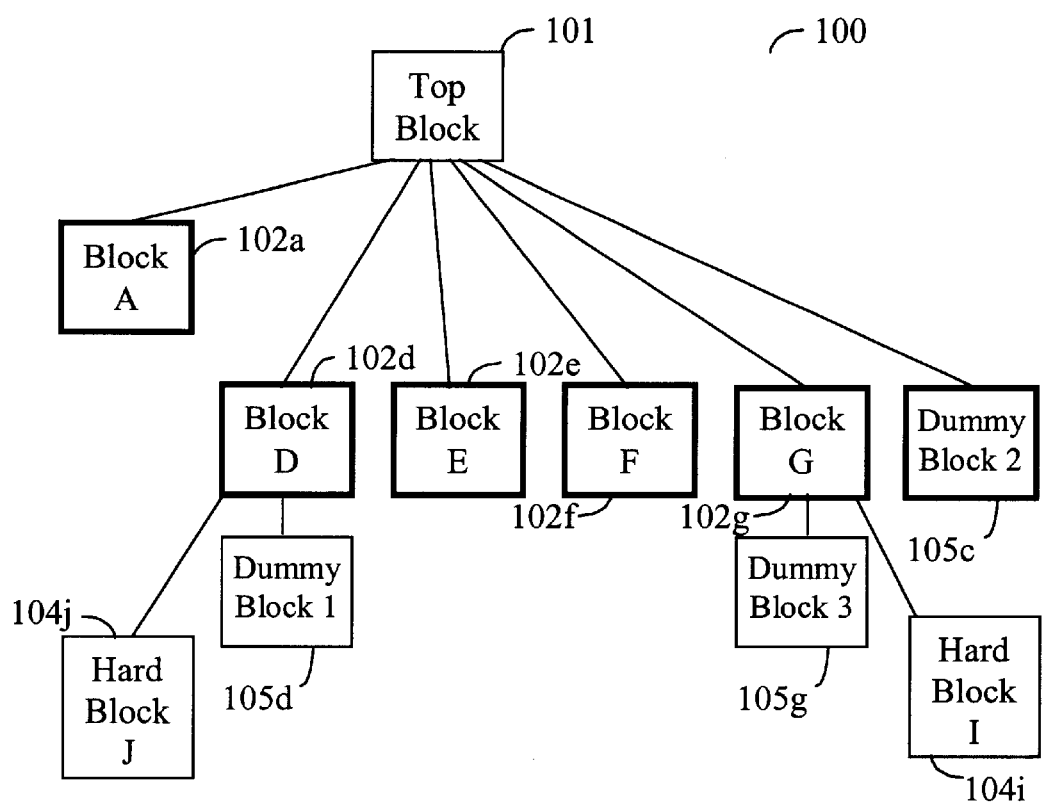
FIG. 5 is a block diagram showing the hierarchy that results after high level blocks are removed or flattened to expose the atomic blocks.

At step 12 of FIG. 1, the design is flattened down to the "A" block level. This process is shown in FIG. 5 for the illustrative design example. Levels of hierarchy above the "A" blocks are generally superfluous for the purpose of creating physical design partitions and are therefore eliminated. Usually, the initial logical design hierarchy is created solely for the convenience of the person doing the functional design and logic simulation of an integrated circuit with little or no thought given to the way the circuit will be physically implemented. Rather than basing a physical layout on the initial logical design hierarchy, it is generally better to eliminate the logical hierarchy to produce a flat group of "A" blocks. These "A" blocks will then be partitioned based on wirelength, area and timing considerations to create a new physical hierarchy which has been optimized for physical implementation. For some integrated circuit design styles, in particular the SOC (System on Chip) design style, the logical hierarchy is designed specifically for physical implementation. SOC designs typically contain large functional or IP (Intellectual Property) blocks such as processors or encoders that are expected to stay together physically. If a chip is designed using this technique, steps 11 through 13 of the flow shown in FIG. 1 are not necessary and may be eliminated.

Figure 6:
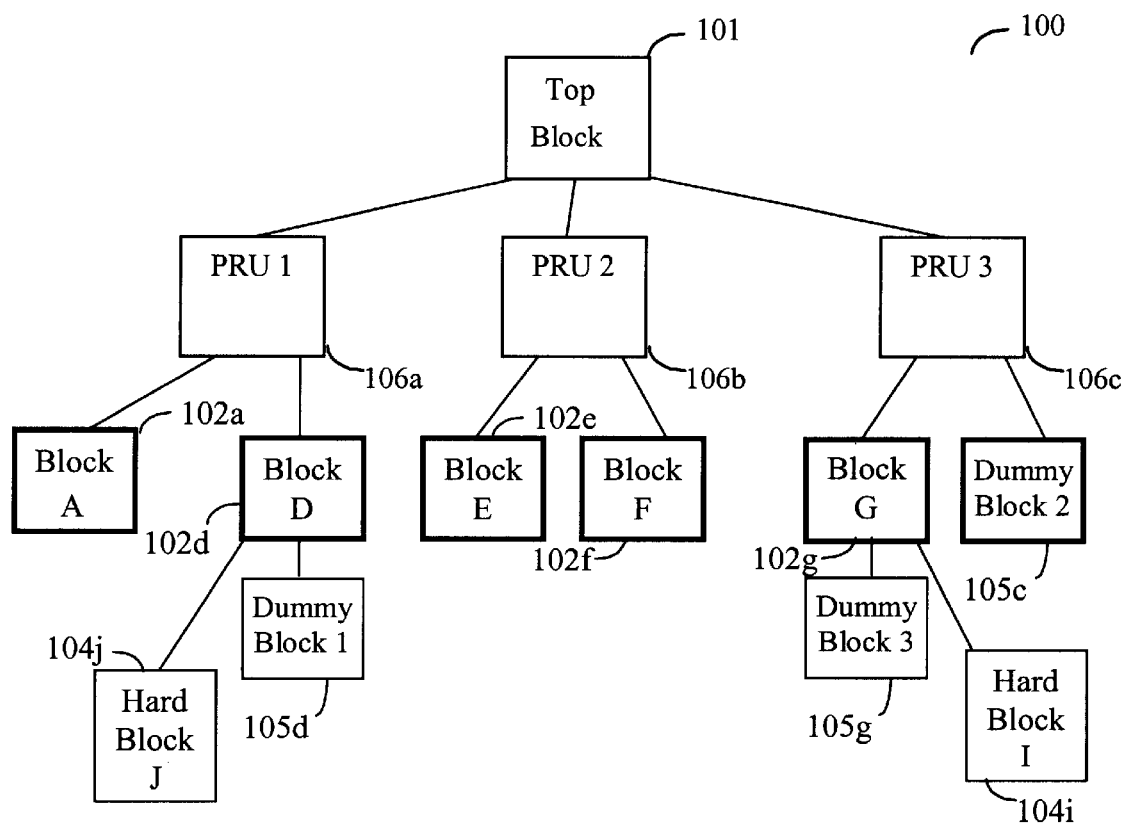
FIG. 6 is a block diagram showing the hierarchy that results after a new level of PRU (Place and Route Unit) blocks are created to represent the physical partitioning of the design.

At step 13 of FIG. 1, a level of hierarchy is created using partitioning software. The operation of this step depends on block placement software that has been previously disclosed in co-pending application Ser. Nos. 09/227,491 and 09/227,023, the disclosures of which are incorporated herein by reference in their entirety. After partitioning, the design 100 will have an additional level of hierarchy as is illustrated in FIG. 6. Three new "place and route units", or PRU blocks 106a, 106b and 106c have been created by grouping sets of "A" blocks together. In the present context, partitioning means the grouping or clustering of "A" blocks. Grouping or clustering of "A" blocks is done so as to minimize overall wirelength, chip area and/or the worst-case timing paths of the design. Since PRUs will eventually be fabricated on the same integrated circuit, it is desirable to minimize the number of critical timing paths that cross the boundaries of PRU blocks. Paths that stay entirely within a PRU block can be more easily optimized at step 22 of FIG. 1 by the standard-cell place and route tool.

Figure 7:
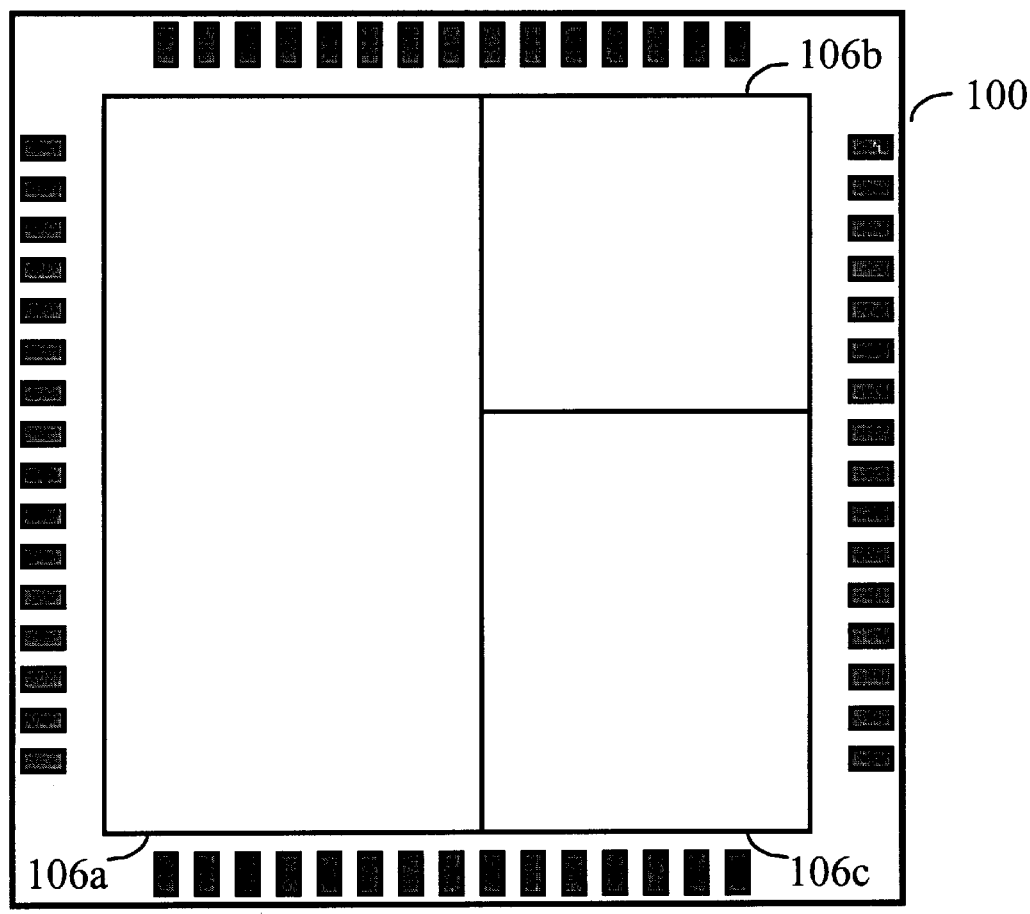
FIG. 7 shows a physical layout corresponding to the hierarchy block diagram of FIG. 6.

After partitioning, these PRU blocks 106a, 106b and 106c have a physical location and shape as is shown in FIG. 7. The PRU blocks will eventually be sent independently to a standard-cell place and route tool for implementation as if they were separate chips. It is desirable that the PRU blocks abut or touch on their edges. This makes the final routing in step 24 of FIG. 1 simpler and also avoids wasting any chip area.

Figure 8:
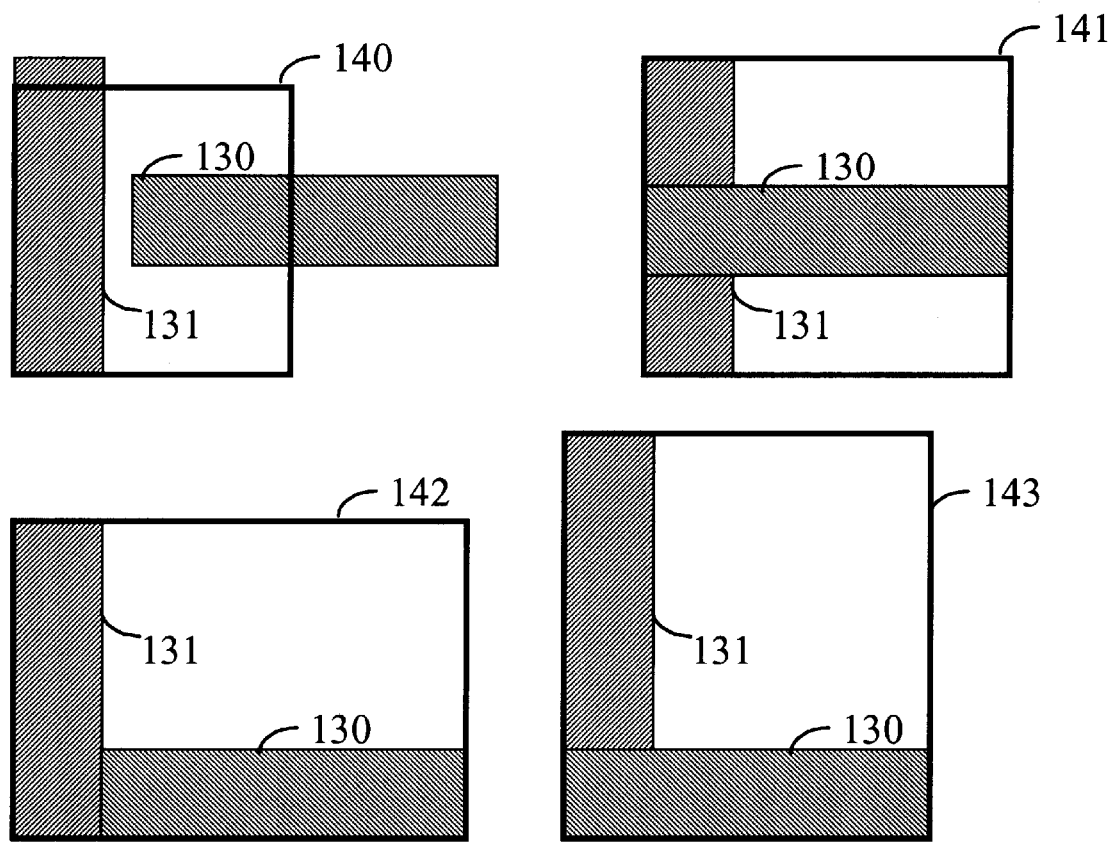
FIG. 8 illustrates a fitting problem where multiple hard blocks must fit within a hierarchical block shape.

The algorithms used in Step 13 will now be disclosed in more detail. During step 13, "A" blocks are partitioned to form PRUs and the PRU shapes, sizes and locations are determined. In this phase, trial placement and partitioning solutions are created and evaluated automatically. It is essential that the PRU shapes created in step 13 are physically realizable, otherwise the internal placement step 15 will fail and step 13 will have to be redone. A PRU shape may not be physically realizable if the PRU contains one or more hard blocks. FIG. 8 illustrates this problem. A PRU is proposed to be created which contains two hard blocks 130 and 131 plus some number of standard cells. PRU shapes 140, 141, 142 and 143 are proposed for implementation. All of these shapes have an area larger than the sum of the areas of hard blocks 130 and 131 plus the areas of additional standard cells proposed to be part of the PRU block. Trial shape 140, however, is not physically realizable because it cannot contain either hard block 130 or 131 within its boundary. Trial shape 141 also is not physically realizable because, although it can contain either hard block 130 or hard block 131, it cannot contain both of them together. Trial shapes 142 and 143 are physically realizable because they can contain both hard blocks 130 and 131 plus the standard cells proposed to be part of the PRU block.

The process of computing a shape function uses a number-partitioning heuristic disclosed in "The differencing method of set partitioning", Technical Report UCB/CSD 82/113 Computer Science Division (EECS), University of California, Berkeley. Each block is represented by its area; the method produces a partition with good area balance. Applying the method recursively to each side of the partition and downward to the leaf-block level yields a slicing tree in which each slice is well balanced. The top-level shape function for the resulting slicing tree can then be computed, using an algorithm given in the prior-art paper entitled "Optimal Orientations of Cells in Slicing Floorplan Designs", Stockmeyer, Information and Control, Volume 57, Numbers 2/3, May/June 1983, Academic Press.

Finding the set of physically realizable shapes for a PRU block based on the internal contents is known as deriving a shape function. In order to derive a legal shape function for a PRU block, it is necessary to find all hard blocks, even if they are hidden at lower levels of the design hierarchy. For example, referring back to FIG. 3, when computing a shape function for the PRU that is to contain "A" block 102g, the lower level hard block 104i must be found and taken into account. Similarly, the lower level hard block 104j must be found and taken into account when computing a shape function for the PRU block that is to contain "A" block 102d. The process of computing a shape function has been disclosed in more detail in the prior-art paper entitled "Efficient Floorplan Optimization", Otten, copyright 1983, IEEE, which discusses a number-partitioning heuristic and also in the prior-art paper entitled "Optimal Orientations of Cells in Slicing Floorplan Designs", Stockmeyer, *Information and Control*, Volume 57, Numbers 2/3, May/June 1983, Academic Press, which discusses an algorithm to compute the top-level shape function for a slicing tree. Both of these papers are incorporated herein by reference in their entirety.

Once a set of valid initial shapes including all hard blocks is generated, the shapes must be augmented to insure that they have room to also fit all of the standard cells that will be part of the proposed PRU. Standard cells are very small relative to hard blocks and are accounted for by adding up the sum of their areas and dividing by the expected utilization and then checking that there is sufficient white space (non-hard block area) within the proposed PRU shape. Typical standard cell utilizations are in the range of 60% to 90%. To be more precise, the following algorithm is used:

Soft=(Sum of all standard cell areas)/(Expected utilization)

White=(Initial Shape Area)−(Sum of all hard block areas)

If (Soft<=White), then the initial shape remains the same, otherwise the initial shape is replaced by a set of new shapes with widths in the range:

[initial shape width, initial shape width+(Soft−White)/(initial shape height)], where the extremes preserve the initial width and the initial height, respectively.

At the conclusion of step 13, a specified number of PRU partitions has been created, each of which has a shape and size sufficient to fit all of its contents. The partitions preferably abut or touch on their edges without any empty (or white) space as is shown in FIG. 7. Within the partitions, all of the blocks are unplaced. In the presently preferred embodiments, the trial hard block locations computed during shape function evaluation are not retained.

Figure 9:
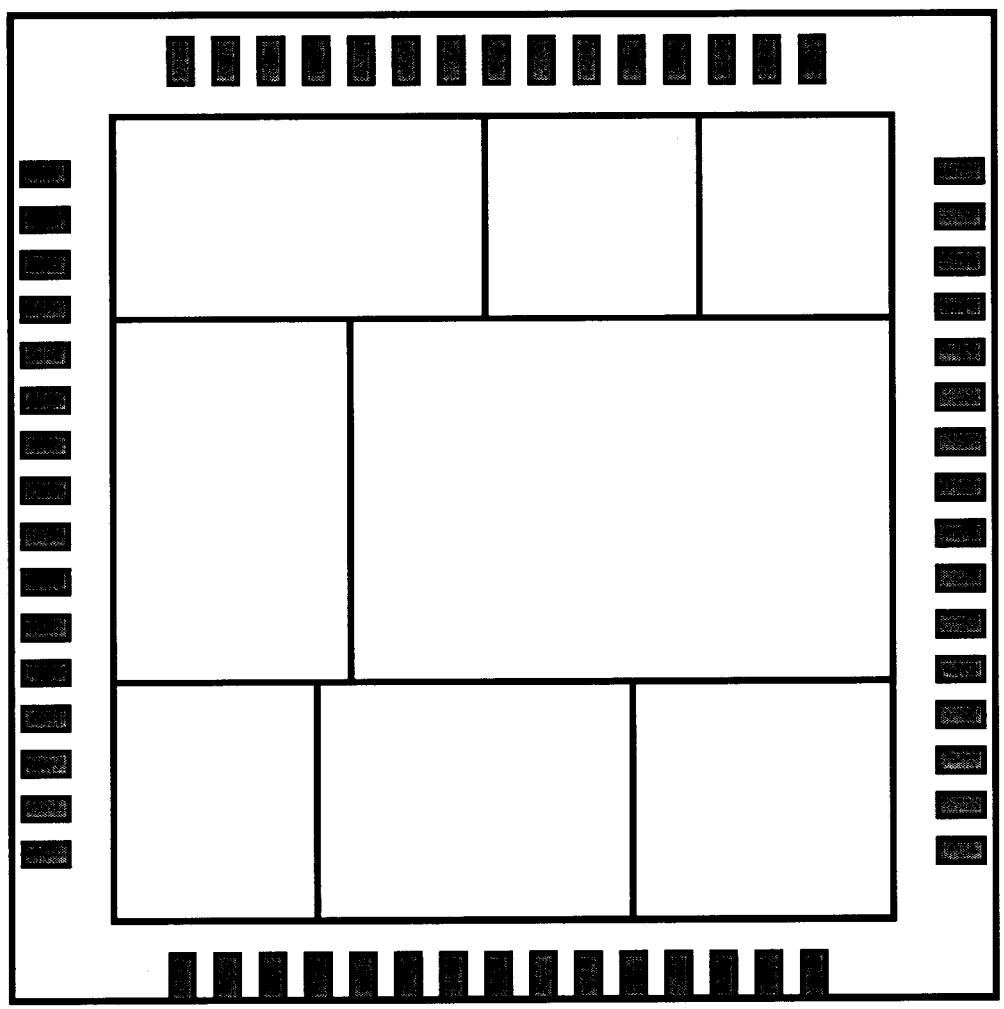
FIG. 9 shows a preferred method for arranging PRU blocks in rows or columns.

In another embodiment of step 13, partitions are created in equal height vertical or horizontal rows. An example of a design partitioned in this way is shown in FIG. 9. This exemplary design has eight partitions, organized into three horizontal rows. The advantage of his particular embodiment, i.e., partitioning into equal height rows, is that updates to the floorplan (the physical arrangement of the circuit elements such as standard cells, hard blocks, etc.) are easier to implement should partition size changes later due to modifications in the netlist. The row that contains the modified partition can simply be extended and the chip size increased slightly without modifying the other partitions.

At step 14 of FIG. 1, a quick top-level port placement is done. Ports are, in effect, electrical contacts on PRUs that allow electrical communication between PRUs. Port placement at step 14 does not need to be highly accurate since port positions will be adjusted later at step 18. This information will be used at step 15 when PRU contents are placed. The preferred algorithm for quick port placement is based on minimizing wire length. Ports connecting to various PRU blocks are preferably placed on the edge of each block to minimize the wire length for each net without shorting to unrelated nets. If two blocks abut and have ports connecting to the same net, the ports will be placed adjacent to each other. The quick port placement is further processed to produce a set of constraints that define on which edge of a PRU block a given port is placed and the preferred order of ports for each PRU edge. The exact location for ports is not useful and is not retained.

Figure 10:
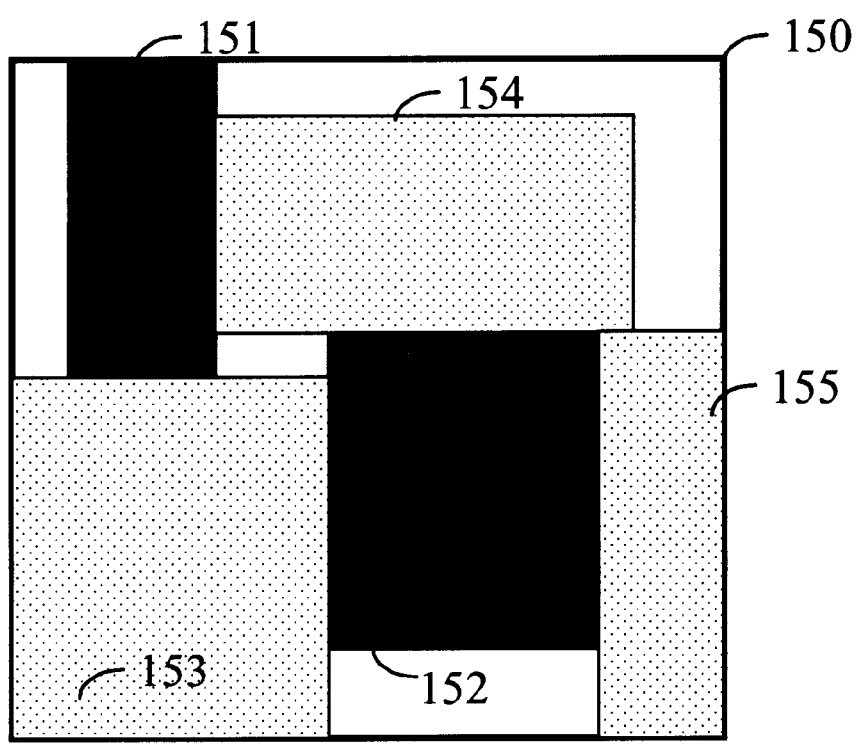
FIG. 10 illustrates a fitting problem when hard and rectangular soft blocks must fit within a hierarchical block.
Figure 11:
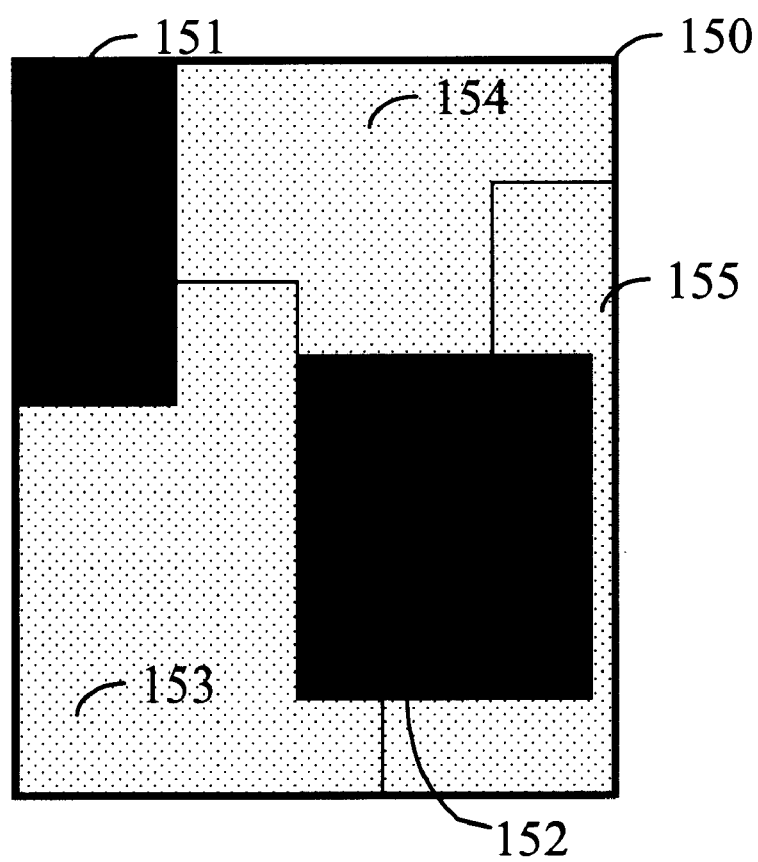
FIG. 11 shows the hierarchical block of FIG. 11 using rectilinear soft blocks instead of rectangular soft blocks.

At step 15 of FIG. 1, blocks within the PRU partitions are placed. In particular, good hard block placement within each PRU is the primary goal of this step. Hard block placement has a major impact on the success or failure of step 22 of FIG. 1 where standard cell place and route is done. Placement of the soft blocks and hierarchical blocks is less important since soft and hierarchical block placement will generally not be utilized in step 22. (A hierarchical block has other blocks below it, as seen in FIG. 5). However, a good hard block placement cannot be done without simultaneously placing soft blocks or hierarchical blocks. The prior-art method for placing soft blocks treats them as rectangles. However, it is generally impossible to get a good placement using only rectangles if there are mixed soft and hard blocks. This problem is illustrated in FIG. 10. Hierarchical block 150 contains two hard blocks, 151 and 152 along with three soft blocks, 153, 154 and 155. It is not possible to place or shape the three soft blocks to fit inside hierarchical block 150 without leaving empty space, forcing hierarchical block 150 to be larger than otherwise necessary. If hierarchical block 150 is larger than necessary, chip area will be wasted, increasing the cost of the design. This problem can be solved by allowing the soft blocks to assume rectilinear shapes as is shown in FIG. 11. Soft blocks 153, 154 and 155 have become rectilinear and hierarchical block 150 has been reduced in size so there is no empty space. A presently preferred algorithm for shaping and placing blocks to eliminate empty space will now be disclosed in more detail.

Figure 12:
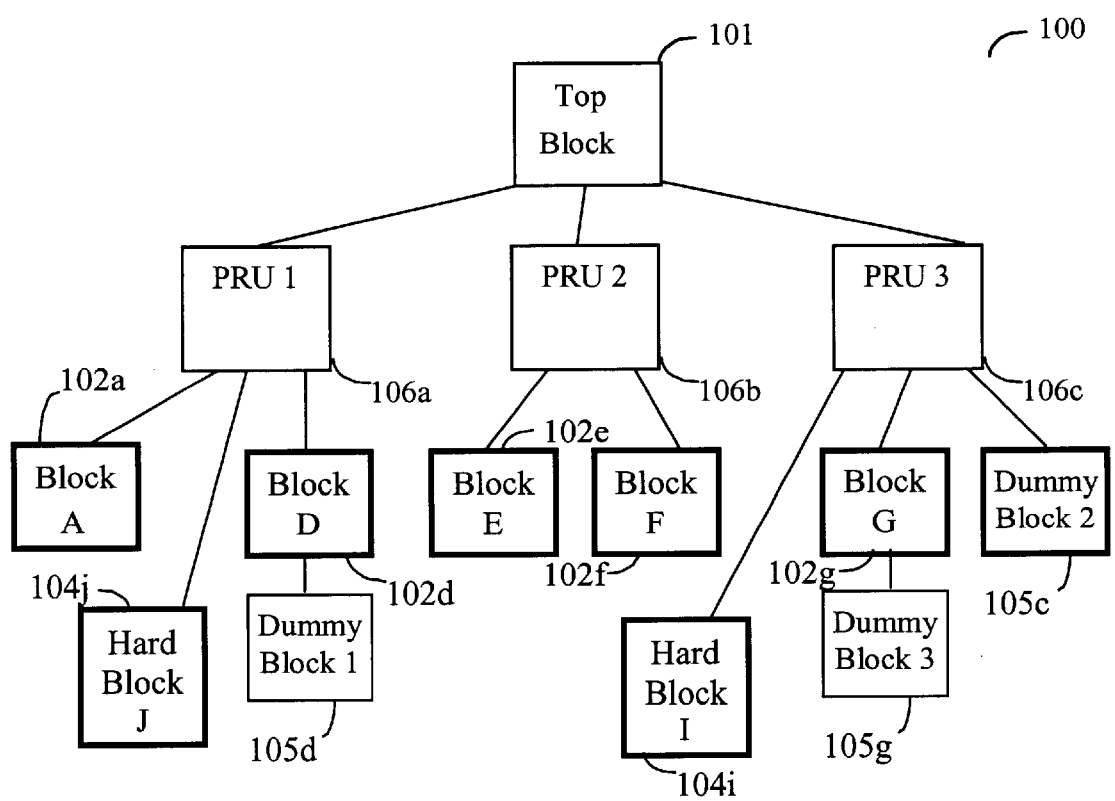
FIG. 12 shows the hierarchy diagram of FIG. 6 after hard blocks have been moved up to the PRU level.

Before beginning placement of blocks within PRU partitions, it is desirable to restructure the design hierarchy to move all hard blocks within "A" blocks up to the PRU level where they can be placed. This is illustrated in FIG. 12. Hard blocks 104$i$ and 104$j$ have been moved out of their parent "A" blocks and brought up so they appear directly underneath their parent PRU blocks. During this hierarchy manipulation, the interfaces to hierarchical blocks 102$d$ and 102$g$ are adjusted as necessary. The hard blocks become additional "A" blocks at this point. Bringing up the hard blocks in this manner allows all of the hard blocks within a PRU block to be placed simultaneously.

The manner in which block placement within PRU blocks is performed will now be discussed. The algorithm has three steps. In the first step, a slicing-tree-based placement of rectangles representing the different blocks is derived. In the second step, a placement for the hard blocks within the desired PRU area is found with minimum perturbation of the result from step 1. In the third step, the hard block instances are treated as fixed or immovable and the soft block instances are re-placed, using more general ("rectilinear") shapes to fit around the hard blocks.

The first step is conducted in a similar fashion as the top-level placement, using successive bipartitioning, to optimize net length, area, and timing.

The goal of hard instance placement can be described as follows if:

B is the target bounding box for the block.

T is a binary slicing tree with leaf nodes, corresponding to all instances. The area of B is $A_{root(T)}$. In other words, the total area is the sum of all instance areas.

$A_m$ is the total area of leaf instances in node m.

Each hard instance has a rectangular shape $\{w_k, h_k\}$

Hard placement is successful if for every hard instance k, having a location $\{X_k, Y_k\}$ within B, each hard instance bounding box $B_k(\{X_k, Y_k\}, \{X_k+w_k, Y_k+h_k\})$ lies and no two hard instance boxes overlap.

Hard block placement begins by removing all of the soft instances and considering only hard instances. First, hard instances alone are checked, following the slicing tree to see if they can fit within B. Soft instances are treated as having zero area. If the hard instances fit, then the soft instances are re-injected to fill B with minimal distortion of the original slicing proportions. To be more precise:

For each node m of T, define:

L=$\{Lw_m, Lh_m\}$—lower-bound width and height capable of holding the hard content of m G=$\{Gw_m, Gh_m\}$—goal width and height for m based on area of child node contents $B = \{Bw_m, Bh_m\}$—box width and height to be computed for m The presently preferred algorithm is then:

$B_{root(T)} = B$;

boil(root(T)); // treat all soft instances as having 0 area if $(Lw_{root(T)} > Bw_{root(t)}$ or $Lh_{root(T)} > Bh_{root(T)})$ exit ("failure"); // could not fit adapt(root(T)); // re-inject soft instance area to fill B for every hard instance node k, $\{X_k, Y_k\} = \{left, bottom\}$ of $B_k$;

The operation of the boil and adapt routines is described below:

```
boil(m) {
if m is a leaf node {Lw_m, Lh_m} = {w_m, h_m} if m is hard or {0, 0} if m is reshapeable;
else { //m has child nodes
    if (axis[m] = 'x') {
        Lw_m = Lw_co[m] + Lw_c1[m]; //shape summing - add child sizes in
            axis[m] dimension
        Lh_m = max(Lh_co[m], Lh_c1[m]); //take max in other dimension
    } else { //when axis[m] = 'y' just switch 'w' with 'h'
        Lh_m = Lh_co[m] + Lh_c1[m];
        Lw_m = max(Lw_co[m], Lw_c1[m]);
    }
}
}
adapt(m) {
//Given parent box B_m derive child boxes B_co[m], B_c1[m] and recurse
if m has child nodes, then {
    B_co[m] = B_c1[m] = B_m; //initialize child node boxes equal to their parent
    if(axis[m] = 'X') {
        Gw_co[m] = (A_co[m]/A_m) * Bw_m; //goal size is proportional to area
        if(Lw_co[m] <= Gw_co[m] <= (Bw_m - Lw_c1[m])) Bw_co[m] = Gw_co[m];
        // if goal leaves room for hard content on both sides, use the goal
        if (Lw_co[m] > Gw_co[m]) Bw_co[m] = Lw_co[m];
        // if hard content on 1st side is too big, make 1st side bigger to fit
        if(Gw_co[m] > (Bw_m - Lw_c1[m])) Bw_co[m] = (Bw_m - Lw_c1[m]);
        // if hard content on 2nd side is too big, make 2nd side bigger to fit
        xMax of B_co[m] = X_Bc1[m] = X_m + Bw_co[m];
    }else { //when axis[m] = 'y' substitute 'y' for 'x' and 'h' for 'w'
        Gh_co[m] = (A_co[m] /A_m) * Bh_m; //goal size is proportional to area
        if(Lh_co[m] <= Gh_co[m] <= (Bh_m - Lh_c1[m])) Bh_co[m] = Gh_co[m];
        // if goal leaves room for hard content on both sides, use the goal
        if (Lh_co[m] > Gh_co[m]) Bh_co[m] = Lh_co[m];
        // if hard content on 1st side is too big, make 1st side bigger to fit
        if (Gh_co[m] > (Bh_m - Lh_c1[m])) Bh_co[m] = (Bh_m - Lh_c1[m]);
        // if hard content on 2nd side is too big, make 2nd side bigger to fit
        yMax of B_co[m] = Y_Bc1[m] = Y_m + Bh_co[m];
    }
    adapt(c0[m]);
    adapt(c1[m]);
}
```

This algorithm will succeed in most cases. In the case of failure or undesirable placement of hard blocks, the hard block placement within the PRU can be adjusted manually or the overall PRU size increased and the top-level floorplan adjusted to fit.

Figure 13:
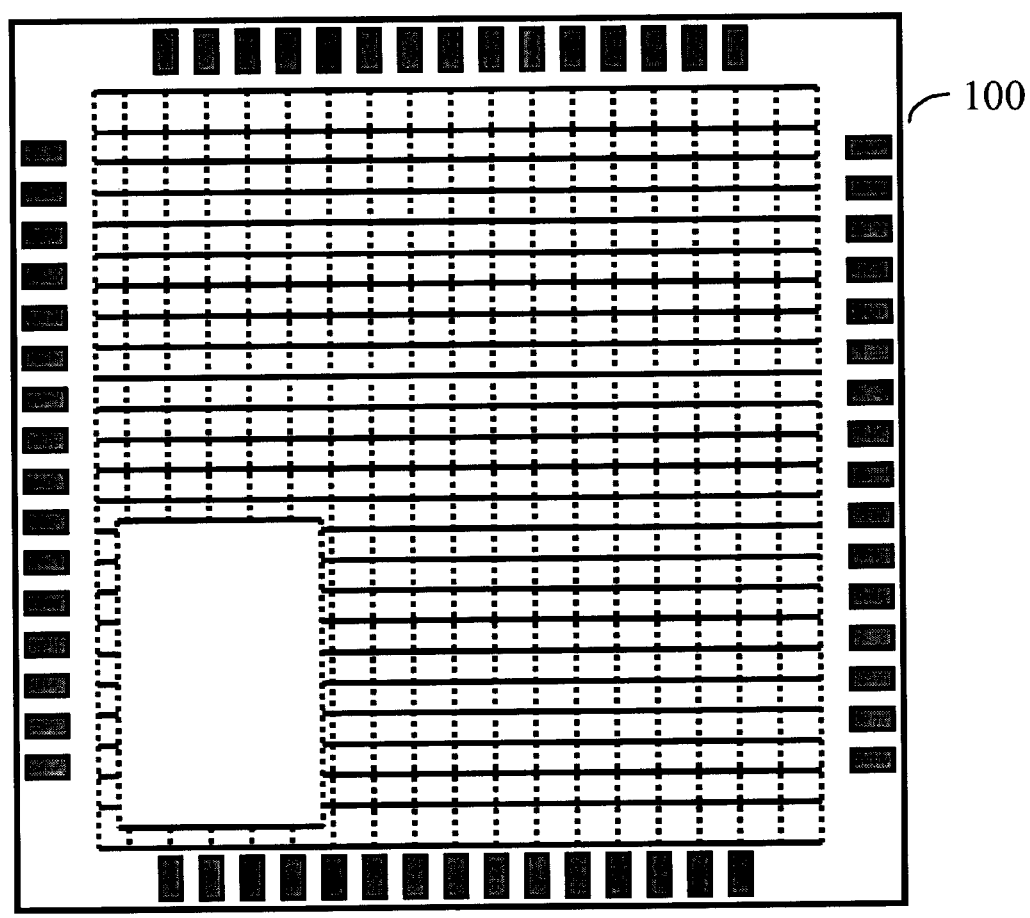
FIG. 13 shows the physical layout of FIG. 7 after a typical power grid has been added.

At step 16 of FIG. 1, power and clock structures are generated. Power structures, in particular, can take up a significant portion of the available routing resources of a chip, and therefore must be defined before routing other signals. Moreover, placement of clock structures can greatly impact the resulting integrated circuit's performance. Power and clock structures may consist of grids, trees or rings of metal interconnect as is well known to those skilled in the art of integrated circuit design. For the standard-cell type of chip, the most common power structure is a set of regular grids of interconnect on various layers. A block placement grid controls where the corners of blocks may be placed so as to insure that all blocks retain the same relationship to the power grid when they are moved or reshaped. The regular power grid is generally stopped and replaced by a power ring at the edges of the chip and around hard blocks. FIG. 13 shows the design, 100 with a simple power grid for one power signal. Two metal layers are used, one in the vertical direction (dashed line) and one in the horizontal direction (solid line). In an actual design, there would be several overlapping power grids and they would be much more complex than is shown in FIG. 13. Power and clock structures may be designed in tools such as Silicon Ensemble from Cadence and imported using a DEF file.

At step 17 of FIG. 1, the design is routed. The goal of routing at this stage is to create the actual ports or physical connection points for signals entering or leaving the PRU blocks. As discussed earlier, the ports created at step 14 were not saved. In the preferred embodiment, a tool known as a global router is used at step 17. Global routers are well known to those skilled in the art of writing electronic design automation software. A global router operates on a grid and provides less accurate routing than a detail router in which the exact coordinates of every net segment and via are computed. In a global router, at each intersection of the grid, a bin is defined for each routing layer. Each bin has a specific net capacity and direction. During global routing, the nets of the design are assigned to a set of bins that represent the approximate routing for the net. As bins approach their capacity, the global router will attempt to route the wire through other bins to minimize the overall routing congestion. A global router is preferred for step 17 of FIG. 1, because the accuracy is sufficient for the purpose of generating port positions and global routers generally run much faster than detail routers. A preferred embodiment of the process for creating port positions using a global router will now be disclosed in more detail.

Figure 14:
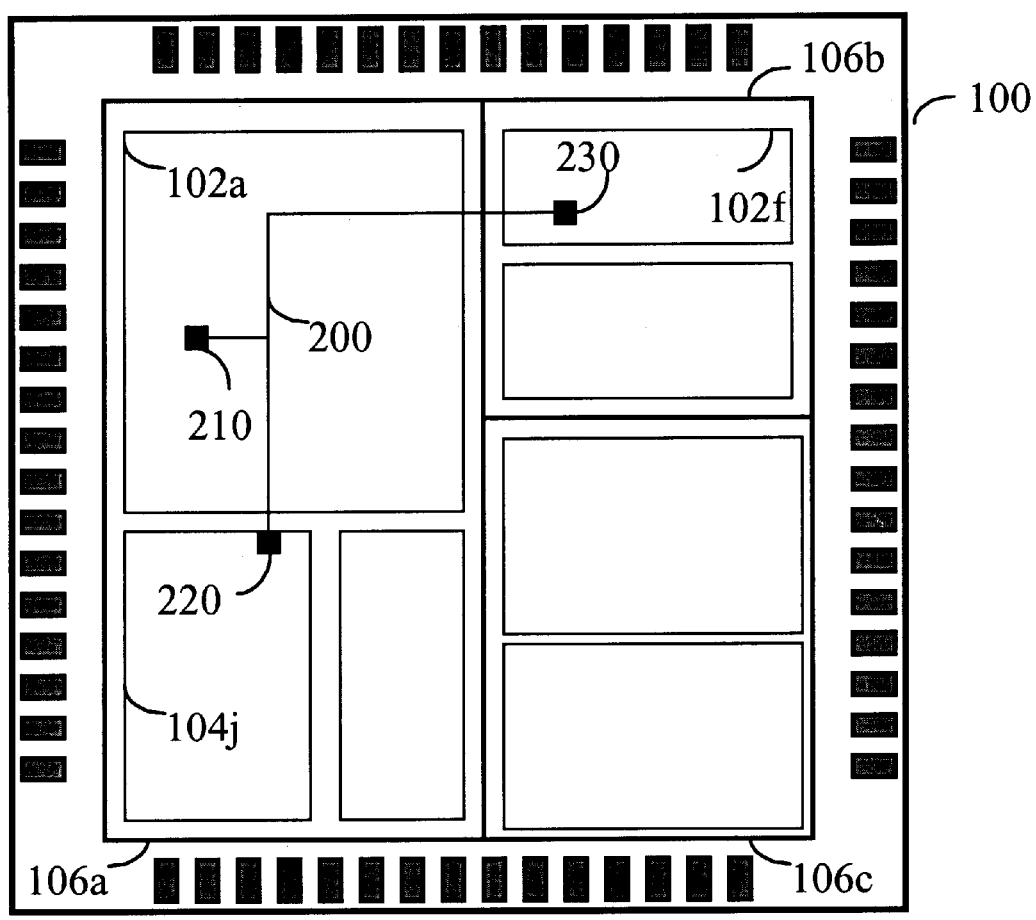
FIG. 14 shows how the design is routed at the top level and how dummy port locations are assigned.

Before the global router can be run, dummy ports must be created on the PRU blocks. Ports are physical rectangles of metal on various layers that provide starting and ending points for routing. A three-step process is used where dummy ports are initially generated in the interior of the PRU blocks, the design is routed, the dummy ports are deleted, and actual ports are created. Since, initially, there is no actual standard-cell placement for the soft blocks within the PRUs, there is little information available on where the nets will actually begin or end. For all nets entering or leaving a PRU, if the net connects internally to a soft block, a dummy port will be created randomly within the area of the soft block. For example, referring to FIG. 14, net 200 connects to PRU blocks 106a and 106b. Within PRU block 106b, net 200 attaches to the soft "A" block 102f. A dummy port is therefore created on top of PRU block 106b for net 200. The dummy port is located randomly within the area that soft block 102f is expected to occupy within PRU 106b. Similarly, net 200 also connects to PRU block 106a. Within PRU block 106a, net 200 connects to soft "A" block 102a and hard "A" block 104j. A dummy port 210 for net 200 is created on top of PRU block 106a which is randomly located within the area that soft block 102a is expected to occupy. A second dummy port 220 for net 200 is created on top of PRU block 106a for hard block 104j. Port locations for hard blocks, however, are known exactly because the layout of hard blocks is predefined. Dummy port 220 on top of PRU 106a, therefore, will be placed in an exact location determined by the placement of hard block 104j and the location of the corresponding port on hard block 104j connecting to net 200.

After dummy ports have been placed on PRU blocks 106a, 106b and 106c for all top level nets, the design will be routed. A route similar to that shown in FIG. 14 for net 200 will be created. The router creates the shortest possible nets connecting to all dummy ports on top of PRU blocks. Nets may also connect to I/O pads or other top-level hard blocks. Routing is done to minimize congestion and to avoid barriers. For example, hard block 104j within PRU 106a will act as a barrier that cannot be routed over. This attempt at routing gives a realistic picture of the routing capacity, both at the top level and within the PRU blocks simultaneously.

After routing has completed, nets are sorted within the global router bins and exact locations are determined where nets cross the edges of the PRU blocks. This step is necessary because a global router only determines net locations within a bin. The exact routing is not calculated. Properties are added to the PRU connectors specifying where the associated ports are to be placed.

Figure 15:
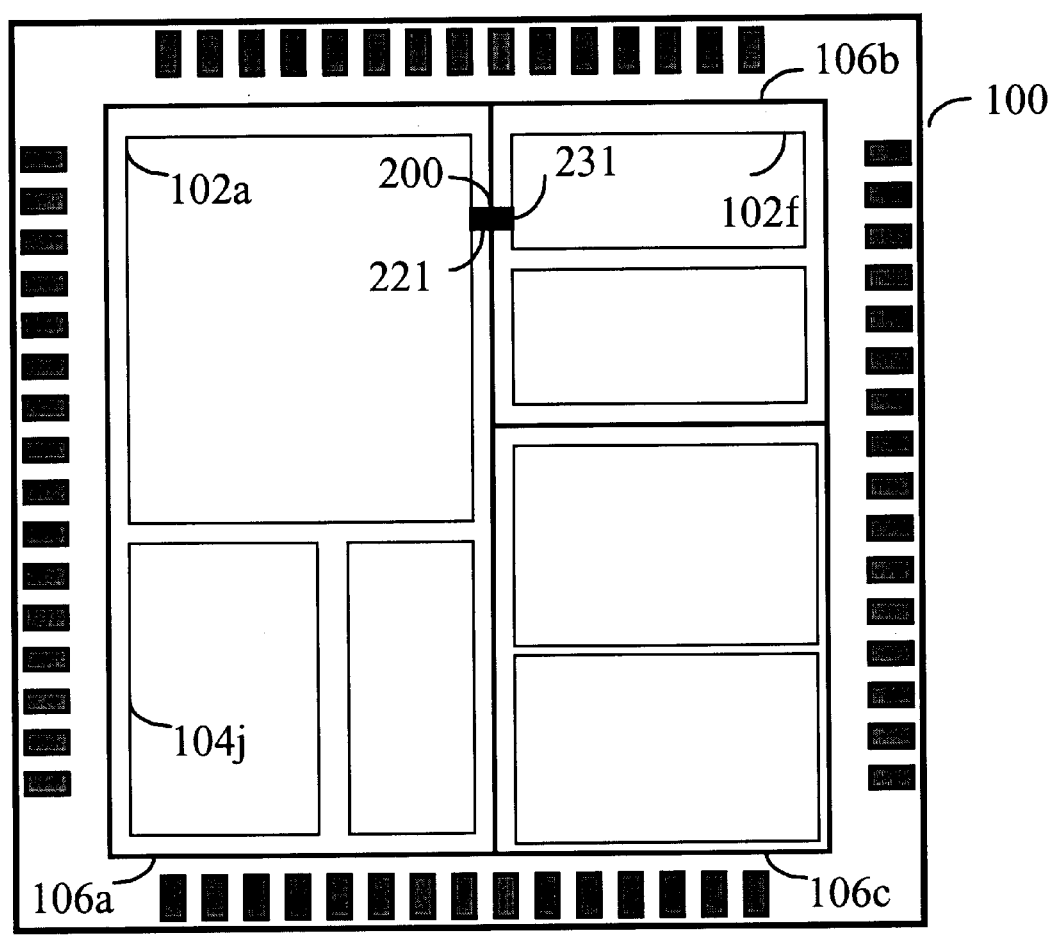
FIG. 15 shows the design of FIG. 14 after real port locations have been created and the dummy port locations removed.

At step 18 of FIG. 1, the dummy ports are deleted and the global router is run again to generate real ports at the edges of the PRU blocks. Ports for nets connecting adjacent PRUs will be placed so that they touch each other at the PRU edge. Referring to FIG. 15, dummy ports 210, 220 and 230 have been deleted, along with their associated routing and new ports 221 and 231 have been created at the edges of PRU blocks 106a and 106b. Net 200 still exists at the top level of design 100 but it has zero length since it only serves to connect the two abutting ports 221 and 231.

It should be noted that it is not essential for the flow that PRUs 106a, 106b and 106c abut although this is generally preferred to simplify the top-level routing. It is also possible to have the PRUs spaced apart with routing connecting them.

Figure 16:
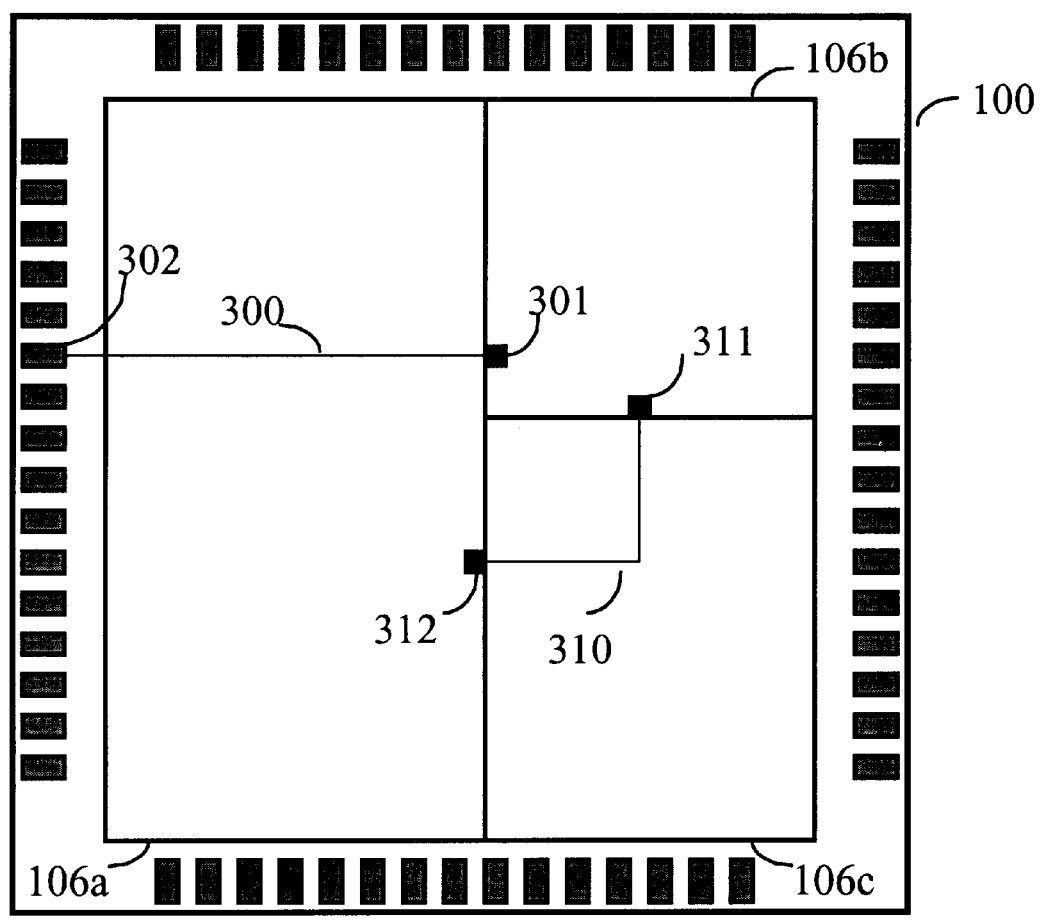
FIG. 16 shows the design of FIG. 14 with additional nets that cross over PRU blocks.

After step 18 of FIG. 1, there will still be nets crossing over PRUs. This occurs because some nets may need to be routed over other PRUs to avoid congestion or to connect two PRUs that are not adjacent to each other. Also, some nets connecting between PRUs and pads or other hard blocks may need to route over other PRUs. Referring to FIG. 16, net 300 connects pad 302 to PRU block 106b and routes over the top of PRU block 106a. Also, net 310 connects PRU block 106a to PRU block 106b but routes over the top of PRU block 106c. This can happen if there is not sufficient room for ports along the common boundary between PRU blocks 106a and 106b. At step 19 of FIG. 1, nets 300 and 310 will be pushed inside PRU blocks 106a and 106c respectively so that there will be no nets routing over the top of PRU blocks 106a, 106b or 106c. Pushing these nets inside the PRU blocks greatly simplifies the top-level routing and allows the standard-cell place and route tool to deal with them at the same time as nets internal to the PRUs. (Details internal to the PRU blocks have been removed from FIG. 16 for clarity).

Figure 17:
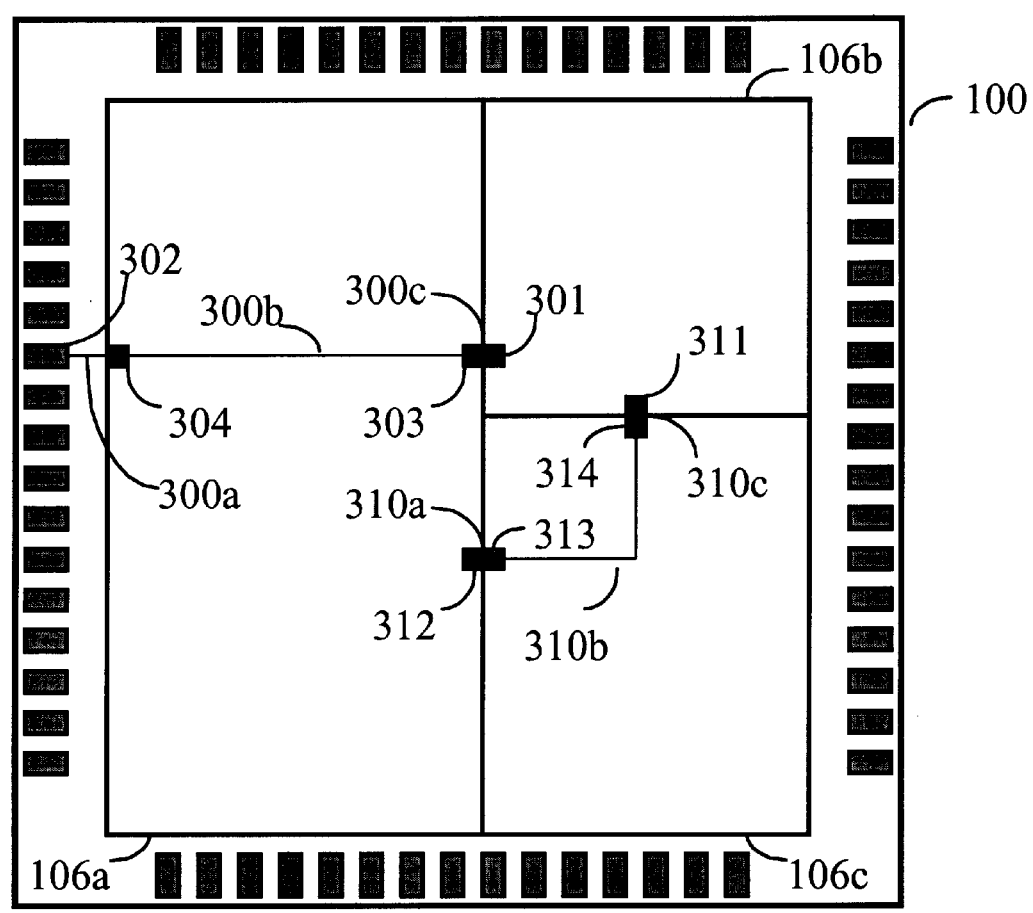
FIG. 17 shows the design of FIG. 16 after the additional nets have been pushed inside the PRU blocks.
Figure 18:
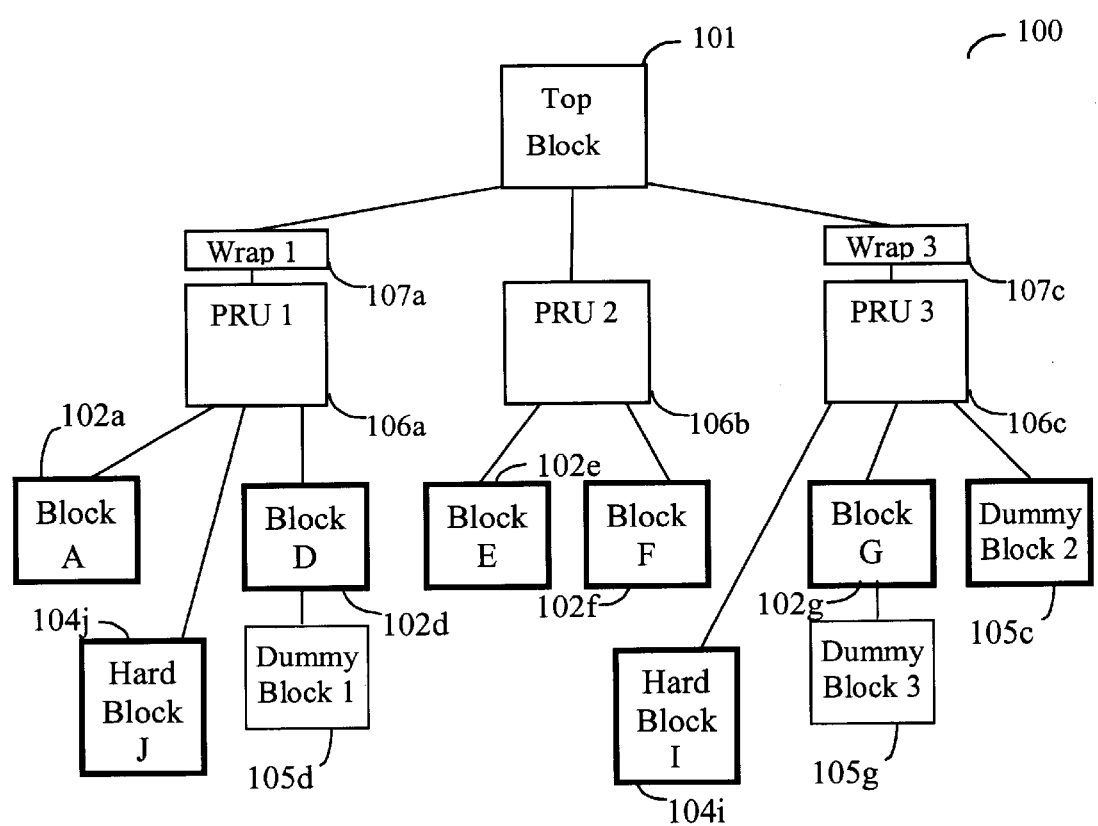
FIG. 18 shows how wrapper blocks are created during the process of pushing nets inside the PRU blocks.
Figure 19:
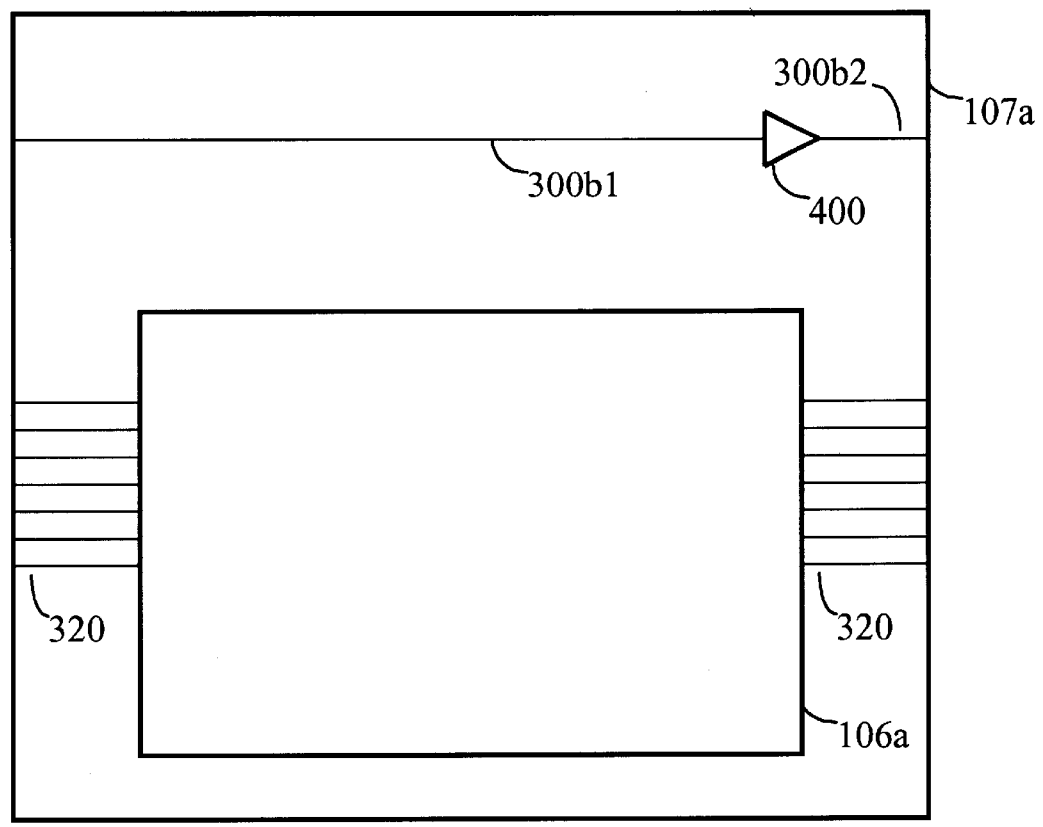
FIG. 19 shows the netlist for a wrapper block including a feed through net and repeater.

Referring to FIG. 17, the process of pushing nets inside the PRU blocks will now be described. Net 300 (from FIG. 16) has been split into three separate nets. Net 300a connects IO pad 302 to a new port 304 on PRU block 106a. Net 300b connects port 304 to port 303 internal to PRU block 106a. Net 300c is a zero length net connecting port 303 on PRU block 106a to port 301 on PRU block 106b. Similarly, net 310 (from FIG. 16) has been split into three separate nets. Net 310a is a zero-length net connecting port 312 on PRU block 106a to port 313 on PRU block 106c. Net 310b connects port 313 to port 314 internal to PRU block 106c. Net 310c is a zero-length net connecting port 314 on PRU block 106c to port 311 on PRU block 106b. When nets are pushed inside PRU blocks, another level of hierarchy is created above the PRU level. This level of hierarchy is referred to herein as a wrapper. The wrapper provides a place to put the additional feedthrough nets such as nets 300b and 310b (from FIG. 17) without modifying the original netlist description for PRU blocks 106a and 106c. The new netlist hierarchy is shown in FIG. 18. New hierarchical wrapper blocks 107a and 107c have been created above PRU blocks 106a and 106c. A netlist is automatically created for wrapper blocks 107a and 107c. FIG. 19 shows a block diagram of wrapper block 107a. PRU block 106a has been encapsulated within block 107a. Connectors on PRU block 106a are attached through new nets 320 to a corresponding set of connectors on wrapper block 107a.

At step 19 of FIG. 1, repeaters may also be generated. A repeater is an electrical amplifier which restores an electrical signal which has been degraded by noise or excessive loading. As is well known in the art of integrated circuit design, correct use of repeaters will reduce signal delay on long nets and correct slew rate problems. At step 19 of FIG. 1, one repeater is generally inserted for each output port on a feedthrough net such as net 300b (from FIG. 17). FIG. 19 shows how the former net 300b (from FIG. 17) has been split into two nets, 300b1 and 300b2 with repeater 400 inserted between. At step 22 of FIG. 1 when standard cell place and route is done, additional repeaters are generated based on the actual length of the routed nets inside the PRUs.

At step 20 of FIG. 1, timing for the design 100 is analyzed. In the preferred embodiment, a software tool known as a static timing analyzer is used. Static timing analyzers are well known in the computer-aided engineering industry. A tool such as Primetime, available from Synopsys, or Pearl, available from Cadence, is suitable for performing step 20 of FIG. 1. Other static timing analysis tools may also be used. To perform the timing analysis of step 20, two inputs are required. The first input is the timing models for all "A" blocks in the design. These models may be generated using the Pearl tool from Cadence or the Primetime tool from Synopsys. Given a netlist of standard cells for the "A" block plus a wireload model, these tools can produce a simplified timing model for the block. A wireload model is a statistical estimate of the parasitic resistance and capacitance expected for each net based typically on the fanout of the net and the size of the block. The timing model retains timing arcs connecting to I/O pins of the "A" block and timing arcs connecting to external timing constraints but does not otherwise retain any internal timing information for the "A" block. Using this type of abstracted timing model for the "A" blocks allows timing for large designs to be analyzed much more quickly and with less memory than would be required to analyze the complete standard-cell netlist for design 100.

The second required input for step 20 of FIG. 1 is a set of external timing constraints. External timing constraints specify the expected timing behavior of design 100. Timing constraints typically specify necessary arrival and required times for design input and output signals, the behavior of design clocks, external resistance and capacitance loading, external rise/fall times and exceptions. Exceptions are timing paths of the design being implemented that are known to have special timing behavior. For example, some timing paths may be known to be static, may not actually occur during real operation of the design, or may be allowed to take multiple clock cycles to transfer information.

Provided with these inputs, the static timing analysis tool can analyze the timing behavior of design 100 and predict the timing behavior for each timing path of the design. After analysis is completed, timing slack is allocated to the PRU blocks. Timing slack, or "slack", is the time obtained for each timing path of design 100 by taking the period of the clock controlling the timing path and then subtracting the expected delays within "A" blocks and the expected wiring delays between "A" blocks. For signals connecting to the external pins of design 100, external arrival and required times are subtracted as well. Expected wiring delays should be computed assuming an optimal use of repeaters. The timing slack for paths going between PRUs is then allocated partially to each PRU containing a portion of the path. Allocating timing slack in this way allows the standard cell place and route tool used at step 22 of FIG. 1 the maximum flexibility for how it will use the timing slack within the separate PRUs. Provided that the timing budget for each PRU is not exceeded during step 22 of FIG. 1, the timing for design 100, will meet the external arrival, required and clock constraints. Timing slack may be allocated primarily to the input pins of blocks, primarily to the output pins or proportionately, based on the expected delay within each PRU block. Allocation primarily to inputs is useful if the "A" block outputs are known to be registered. Allocation primarily to outputs is useful if the "A" block inputs are known to be registered. Proportional allocation is useful if signals are not registered.

Exceptions (i.e., timing paths of the design being implemented that are known to have special timing behavior) are also propagated to the PRU blocks at step 20 of FIG. 1. For example, a multi-cycle timing path may originate within one PRU block and terminate in another PRU block. For correct operation of the standard cell place and route at step 22 of FIG. 1, it is important that multi-cycle paths and other types of exception constraints be known for each PRU block.

At step 21 of FIG. 1, PRU data is generated. A sufficient set of data is required for each PRU so that it may be implemented at step 22 without any knowledge of other PRUs or the overall design 100. The required set of PRU data includes the following items:

The shape and size of the PRU block

The location of ports on the PRU block

The location and orientation of all hard macros within the PRU block

The standard-cell netlist for the PRU block

Timing contraints including arrival/required times, parasitics, rise/fall times and exceptions for all signals connecting to the PRU block Physical and timing specifications for any hard blocks or standard cells used within the PRU block At step 22 of FIG. 1, the PRU blocks are physically implemented. Software tools such as Silicon Ensemble or PKS, both available from Cadence, may be used at this step. Following physical implementation, a corrected set of PRU data is generated. This data typically includes the following items:

A physical definition of the PRU block, typically in LEF or GDSII format.

An updated timing model for the PRU block.

Location of standard cells within the PRU block which connect to ports of the block, typically in PDEF or DEF format.

Additional information such as routing congestion within the PRU block may also be generated.

At step 23 of FIG. 1, the floorplan for design 100 is updated. Following physical implementation of the PRU blocks at step 22, changes to the top-level floorplan will often be needed. This generally occurs because the size or timing for the PRU block could not be estimated with sufficient accuracy earlier in the flow. If changes are necessary, the floorplan is updated and timing is recalculated at step 20 of FIG. 1. This loop can often be avoided by providing some margin in the timing and physical constraints generated at step 21 of FIG. 1.

Figure 20:
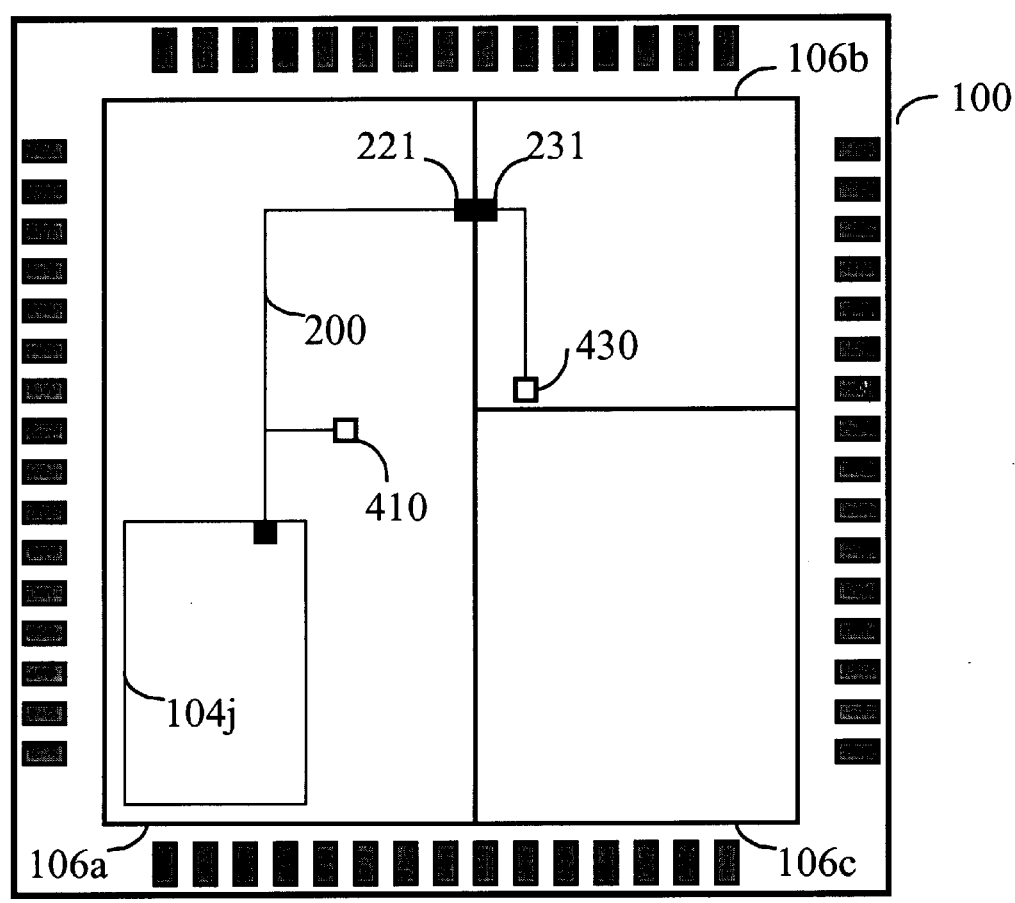
FIG. 20 shows how port positions may be non-optimal following standard-cell place and route of the PRU blocks.
Figure 21:
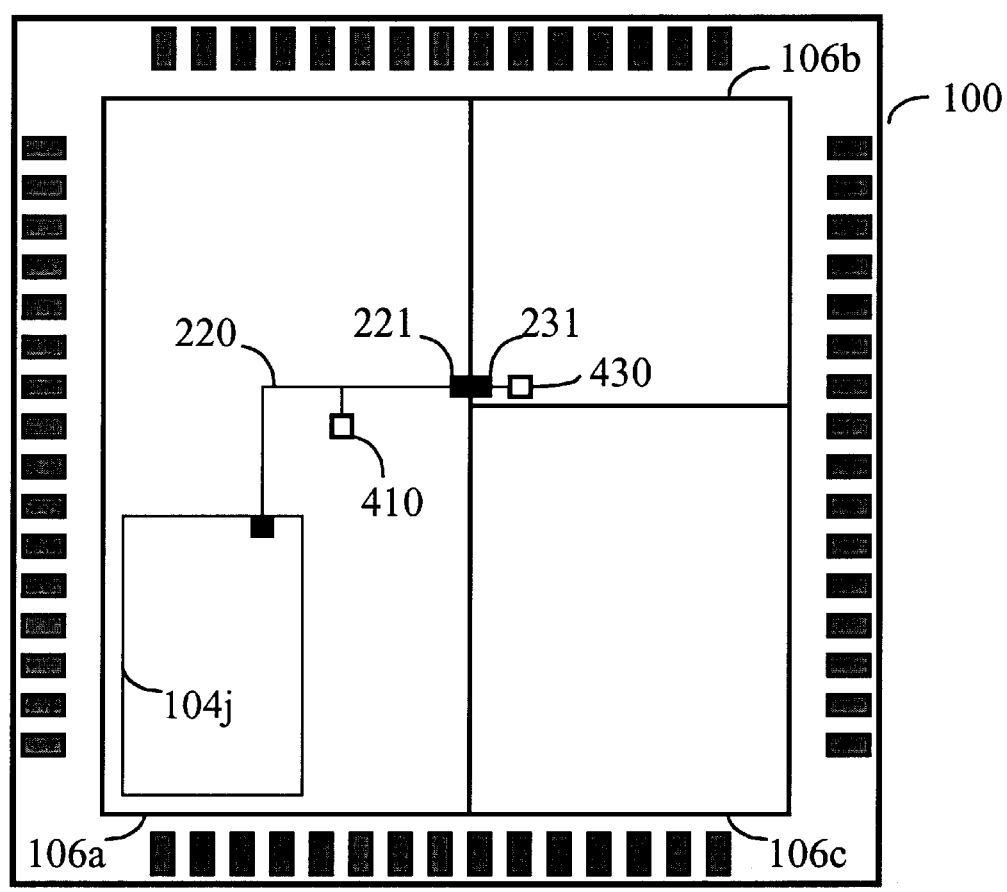
FIG. 21 shows how port positions may be later improved based on actual standard cell locations for the PRUs.

A further optimization may also be done at step 23 of FIG. 1. Since very little is known about the actual placement of standard cells until step 22 is completed, it is likely that the port locations defined at step 18 will not be optimal for routing within the PRU blocks. By re-adjusting port positions after the actual location of standard cells connecting to I/O pins is known, the routing can frequently be simplified, reducing routing congestion and improving timing behavior. Referring to FIG. 20, the net 200 is shown after the completion of standard cell place and route at step 22 of FIG. 1. Standard cells 410 and 430 did not end up getting placed in the same location as dummy ports 210 and 230 respectively from FIG. 14. As a result, ports 221 and 231 would force net 200 to be longer than otherwise necessary to connect to standard cells 410 and 430 plus hard block 104j. This problem can be corrected by reading back the actual location of standard cells 410 and 430 following the detailed place and route of PRU blocks 106a and 106b. Detailed placement information is typically available in the DEF or PDEF formats following standard cell place and route at step 22 of FIG. 1. A global router is used again as in steps 17 and 18 of FIG. 1 to adjust the position of ports 221 and 231. Since the location of standard cells 410 and 430 is now known exactly, dummy ports can be placed at exact rather than estimated locations and the resulting positions of ports 221 and 231 can be improved as shown in FIG. 21. Global routing may also take advantage of detailed routing congestion information within the PRUs at this stage to further optimize port positions. The routing of PRUs 106a and 106b is then incrementally modified to adjust for the new port positions.

Following the satisfactory completion of step 23 of FIG. 1, the chip design is finished at step 24 by doing top-level detail routing to connect external I/O pins to the PRU blocks and to connect any non-abutted PRU blocks together. Final physical, functional, connectivity and timing verification are performed and then a final tapeout file, typically in GDSII format, is prepared for fabrication. Step 24 of FIG. 1 is well understood by those familiar with the art of integrated circuit design and will not be described further here.

Thus, a preferred method physically designing integrated circuits has been described. While embodiments and applications of this invention have been shown and described, as would be apparent to those skilled in the art, many more embodiments and applications are possible without departing from the inventive concepts disclosed herein. Therefore, the invention is not to be restricted except in the spirit of the appended claims.

We claim:

1. A method for physically designing an integrated circuit comprising:
   importing a netlist description of an integrated circuit design, said netlist description comprising a plurality of hierarchical arranged branches;
   selecting atomic blocks for each of said plurality of hierarchically arranged branches, each of said atomic blocks selected to be one or more hierarchy levels above the bottom of a corresponding one of said hierarchically arranged branches, each of said atomic blocks being either an atomic hard block, an atomic soft block or an atomic hierarchical block;
   flattening each of said plurality of hierarchically arranged branches by eliminating superfluous levels of hierarchy above said atomic blocks;
   partitioning each of said atomic blocks into one of a plurality of place and route units ("PRUs"); and
   positioning said atomic blocks within each of said plurality of PRUs.

2. The method of claim 1 wherein said partitioning step includes:
   determining a physically realizable shape for each of said plurality of PRUs;
   determining a physically realizable size for each of said plurality of PRUs; and
   determining PRU location for each of said plurality of PRUs.

3. The method of claim 2 wherein said determining PRU shape step includes:
   finding all of said atomic hard blocks and other hard blocks within each of said plurality of PRUs;
   calculating an initial PRU shape for each of said plurality of PRUs;
   determining whether said atomic hard blocks, said other hard blocks, and all standard cells assigned to said initial PRU shape will fit within said initial PRU shape; and
   if said atomic hard blocks, said other hard blocks, and all of said standard cells assigned to said initial PRU shape do not fit within said initial PRU shape, calculating an alternate initial PRU shape and determining whether said atomic hard blocks, said other hard blocks, and all of said standard cells assigned to said initial PRU shape will fit within said initial PRU shape.

4. The method of claim 1 wherein said positioning step further includes:
   moving all of said atomic hard blocks within a particular one of said plurality of PRUs such that each of said atomic hard blocks is one level of hierarchy below said particular one of said PRU;
   determining optimal placement of each of said atomic blocks; and
   selecting a rectilinear shape for each of said soft atomic blocks and said atomic hierarchical blocks within said particular one of said plurality of PRUs so that said soft atomic blocks and said atomic hierarchical blocks fit within areas of said particular one of said plurality of PRUs left unoccupied by said atomic hard blocks.

5. The method of claim 1 further including:
   routing interconnections between said plurality of PRUs;
   where one of said interconnections crosses an edge of one of said PRUs, assigning a port at said edge of one of said plurality of PRUs, said port comprising an electrical contact at said edge of one of said PRUs;
   pushing said interconnections inside said plurality of PRUs; and
   creating a physical circuit layout for each of said plurality of PRUs.

6. The method of claim 5, wherein said pushing step results in at least one wrapper block containing said one of said PRUs and said one of said interconnections, wherein said one of said interconnections does not crossover said one of said PRUs in said wrapper block.

7. The method of claim 1, wherein said partitioning step does not divide any of said atomic blocks.

8. The method of claim 1, further including: designating at least one of said atomic blocks as stopped.

9. The method of claim 8, wherein said at least one of said atomic blocks contains no hard blocks.

10. The method of claim 1, further including: creating at least one dummy block from said netlist.

11. The method of claim 10, wherein said at least one dummy block is a grouping of standard cells.

12. The method of claim 1, wherein said superfluous levels of hierarchy include all levels of hierarchy between said atomic blocks and a top level block.

13. The method of claim 1, wherein said partitioning step includes:
   generating an initial shape for a PRU in said plurality of PRUs, wherein said initial shape is sufficient for containing all hard blocks in said PRU; and
   determining whether said initial shape is sufficient for containing all standard cells in said PRU.

14. The method of claim 13, wherein said partitioning step further includes:
   augmenting said initial shape to obtain an augmented shape for said PRU, wherein said augmented shape is sufficient for containing all of said hard blocks in said PRU and all of said soft blocks in said PRU.

15. The method of claim 14, wherein said generating step, said determining step, and said augmenting step are performed for each PRU in said plurality of PRUs.

16. The method of claim 1, wherein said partitioning step results in each PRU in said plurality of PRUs abutting at least one other PRU in said plurality of PRUs.

17. The method of claim 1, wherein said partitioning step results in PRUs in said plurality of PRUs being aligned in equal height vertical rows.

18. The method of claim 1, wherein said partitioning step results in PRUs in said plurality of PRUs being aligned in equal height horizontal rows.

19. The method of claim 1, wherein said positioning step includes:
   moving all of said atomic hard blocks within a PRU in said plurality of PRUs to be one level of hierarchy below said PRU;

placing said all of said atomic hard blocks in said PRU; and selecting a rectilinear shape for at least one atomic soft block in said PRU.

20. The method of claim 19, further including:

selecting a rectilinear shape in said PRU for each atomic soft block in said PRU and each atomic hierarchical block in said PRU so that said each atomic soft block and said each atomic hierarchical block fits within areas of said PRU left unoccupied by said all of said atomic hard blocks.

21. The method of claim 1, wherein said positioning step results in at least one atomic block in a PRU in said plurality of PRUs having a rectilinear shape.

22. The method of claim 21, wherein said at least one atomic block is an atomic soft block.

23. The method of claim 1, further including:

creating dummy ports on multiple PRUs in said plurality of said PRUs, said dummy ports enabling a net to traverse from a first PRU of said multiple PRUs to a second PRU of said multiple PRUs.

24. The method of claim 23, wherein a first dummy port is created on an atomic soft block in said first PRU and a second dummy port is created on an atomic hard block in s second PRU.

25. The method of claim 24, wherein said first dummy port is located at a random location on said atomic soft block in said first PRU and said second dummy port is located at an exact location on said atomic hard block in said second PRU.

26. The method of claim 23, further including:

connecting said dummy ports by routing nets between said dummy ports;

determining where said routing nets cross edges of said multiple PRUs;

deleting said dummy ports; and generating real ports where said routing nets cross edges of said multiple PRUs.

27. The method of claim 1, further including:

allocating slack time to PRUs in said plurality of PRUs.

28. The method of claim 27, wherein said slack time is allocated to at least one PRU in said set of PRUs primarily to block input pins.

29. The method of claim 27, wherein said slack time is allocated to at least one PRU in said set of PRUs primarily to block output pins.

30. The method of claim 27, wherein said slack time is allocated to at least one PRU in said set of PRUs proportionately between block input pins and block output pins, based on expected delay within said at least one PRU.

31. A method of routing an integrated circuit design comprised of a plurality of place and route units ("PRUs"), comprising:

creating dummy ports on each of said PRUs, said dummy ports allowing a net to traverse from a first of said plurality of PRUs to a second of said plurality of PRUs;

connecting said dummy ports on said PRUs by routing nets between them;

determining where said routing nets cross edges of said plurality of PRUs;

deleting said dummy ports; and generating real ports where said routing nets cross edges of said plurality of PRUs.

32. A method of fitting an integrated circuit design within a predefined area, the integrated circuit design comprising one or more of hard blocks, hierarchical blocks and soft blocks, the hard blocks having a fixed shape, comprising:

determining optimal placement of each of the hard blocks, if any, within the predefined area; and selecting a rectilinear shape for each of the soft blocks, if any, and hierarchical blocks, if any, so that the soft blocks, if any, and hierarchical blocks, if any, fit within spaces of the predefined area left unoccupied by the hard blocks.

33. A method of fitting an integrated circuit design within a predefined area, said method comprising:

determining placement of at least one hard block within the predefined area, wherein said at least one hard block has a predefined shape; and selecting a rectilinear shape for at least one block within the predefined area, such that said at least one block fits within space in said predefined area left unoccupied by said at least one hard block.

34. The method of claim 33, wherein said at least one block includes multiple blocks.

35. The method of claim 34, wherein said at least one block includes a soft block.

36. The method of claim 34, wherein said at least one hard block includes multiple hard blocks.

* * * * *